United States Patent
Ohashi et al.

(10) Patent No.: US 9,052,499 B2
(45) Date of Patent: Jun. 9, 2015

(54) VIBRATING APPARATUS, DRIVING APPARATUS HAVING THE VIBRATING APPARATUS, AND OPTICAL DEVICE

(71) Applicant: CANON KABUSHIKI KAISHA, Tokyo (JP)

(72) Inventors: Kaishi Ohashi, Tokyo (JP); Toshifumi Urakami, Yokohama (JP); Toshihiro Ifuku, Yokohama (JP); Yasushi Shimizu, Fujisawa (JP); Tatsuo Furuta, Machida (JP); Takanori Matsuda, Chofu (JP); Makoto Kubota, Yokohama (JP); Jumpei Hayashi, Chofu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 124 days.

(21) Appl. No.: 13/789,338

(22) Filed: Mar. 7, 2013

(65) Prior Publication Data
US 2013/0250417 A1    Sep. 26, 2013

(30) Foreign Application Priority Data
Mar. 21, 2012 (JP) ................. 2012-063898

(51) Int. Cl.
  *G02B 1/00* (2006.01)
  *G02B 27/00* (2006.01)
  (Continued)

(52) U.S. Cl.
  CPC .......... *G02B 27/0006* (2013.01); *H01L 41/43* (2013.01); *H01L 41/042* (2013.01); *H01L 41/0973* (2013.01); *H01L 41/1871* (2013.01);
  (Continued)

(58) Field of Classification Search
  CPC .... G02B 27/0006; H02P 25/027; H04N 5/225
  USPC .................................... 359/507, 508
  See application file for complete search history.

(56) References Cited

U.S. PATENT DOCUMENTS

| 5,001,404 A | 3/1991 | Kataoka |
| 7,778,542 B2 | 8/2010 | Oshima |

(Continued)

FOREIGN PATENT DOCUMENTS

| CN | 101344641 A | 1/2009 |
| CN | 100485514 C | 5/2009 |

(Continued)

OTHER PUBLICATIONS

F. Benabdallah et al; "Linking Large Piezoelectric Coefficients to Highly Flexible Polarization of Lead Free BaTiO3-CaTiO3-BaZrO3 Ceramics;" Journal of Applied Physics; 109, 124116 (2011); pp. 124116-1 to 124116-6.

*Primary Examiner* — Euncha Cherry
(74) *Attorney, Agent, or Firm* — Canon USA, Inc. IP Division

(57) ABSTRACT

A vibration apparatus includes a vibrating body that includes a piezoelectric material having a lead content of less than 1000 ppm, and has an electromechanical energy converting element having an electrode; and a control unit that applies at least two driving voltages to the electromechanical energy converting element, and generates a combined vibration by providing a time phase difference to the vibrating body and generating multiple stable waves having mutually different orders; wherein the control unit changes at least one of the voltage amplitude ratio and time phase difference of at least two driving voltages, so as to change the amplitude distribution of the combined vibration.

13 Claims, 16 Drawing Sheets

(51) Int. Cl.
*H01L 41/43* (2013.01)
*H01L 41/04* (2006.01)
*H01L 41/09* (2006.01)
*H01L 41/187* (2006.01)
*H02N 2/00* (2006.01)
*H04N 5/217* (2011.01)
*H01L 41/18* (2006.01)
*H02P 25/02* (2006.01)
*H04N 5/225* (2006.01)

(52) U.S. Cl.
CPC ............ *H02N 2/0015* (2013.01); *H02N 2/008* (2013.01); *H04N 5/2171* (2013.01); *H01L 41/18* (2013.01); *H02P 25/027* (2013.01); *H04N 5/2253* (2013.01)

(56) References Cited

U.S. PATENT DOCUMENTS

| | | | |
|---|---|---|---|
| 2002/0149653 A1* | 10/2002 | Sasaki et al. | 347/70 |
| 2009/0206698 A1 | 8/2009 | Okazaki | |
| 2010/0246001 A1 | 9/2010 | Urakami et al. | |
| 2011/0096397 A1 | 4/2011 | Ohashi | |
| 2011/0228389 A1 | 9/2011 | Ohashi | |
| 2012/0032557 A1 | 2/2012 | Furuta | |

FOREIGN PATENT DOCUMENTS

| | | |
|---|---|---|
| CN | 101937131 A | 1/2011 |
| CN | 102107199 A | 6/2011 |
| EP | 2330460 A1 | 6/2011 |
| JP | 2008-207170 A | 9/2008 |
| WO | 2012/133604 A1 | 10/2012 |

* cited by examiner

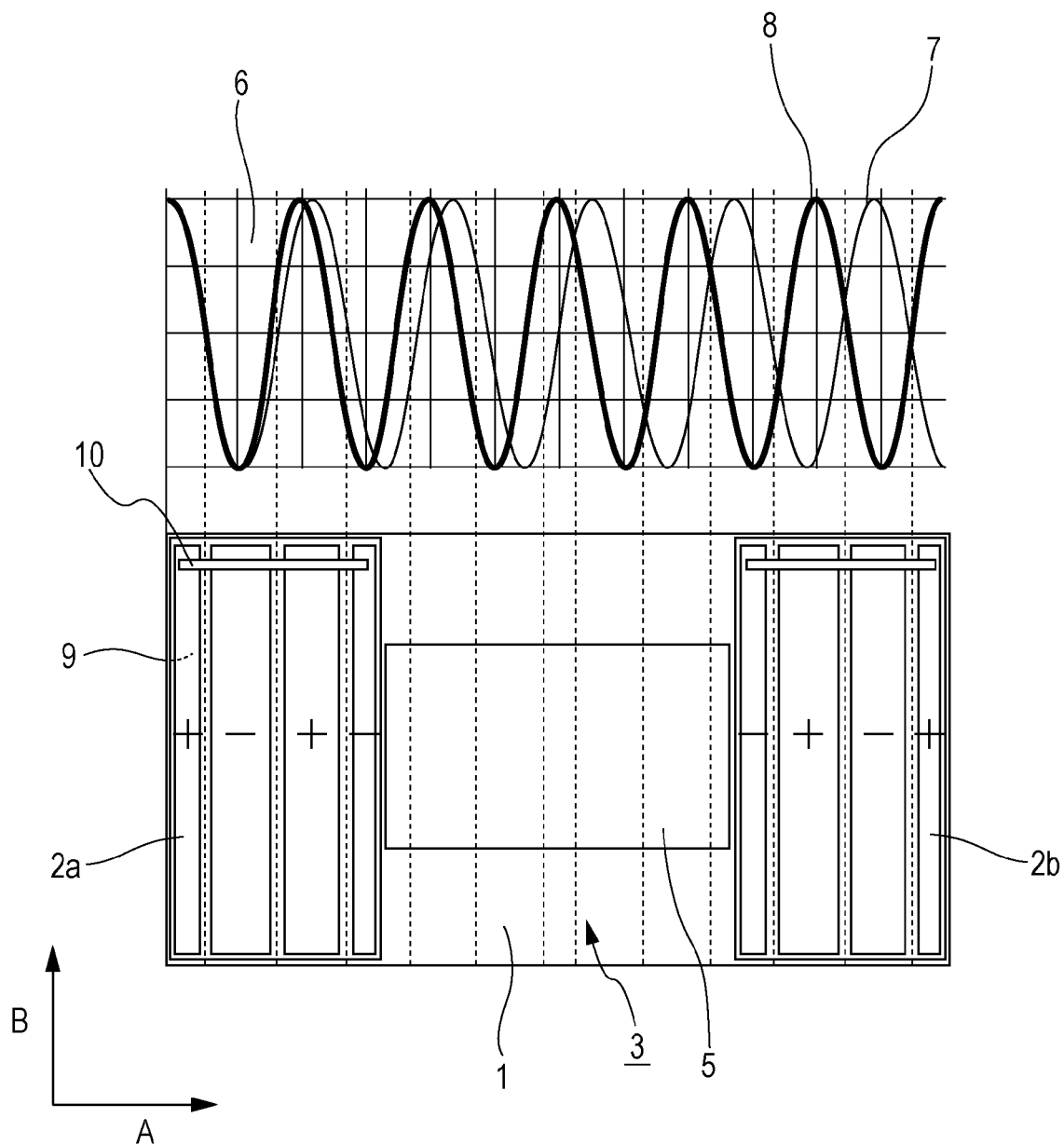

FIG. 6A-1
FIG. 6A-2
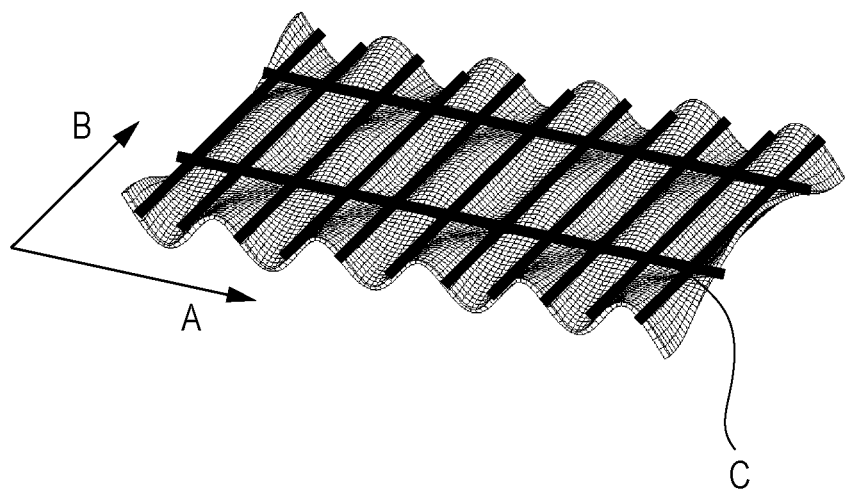
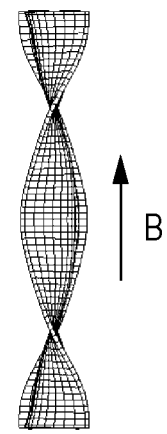
FIG. 6B-1
FIG. 6B-2
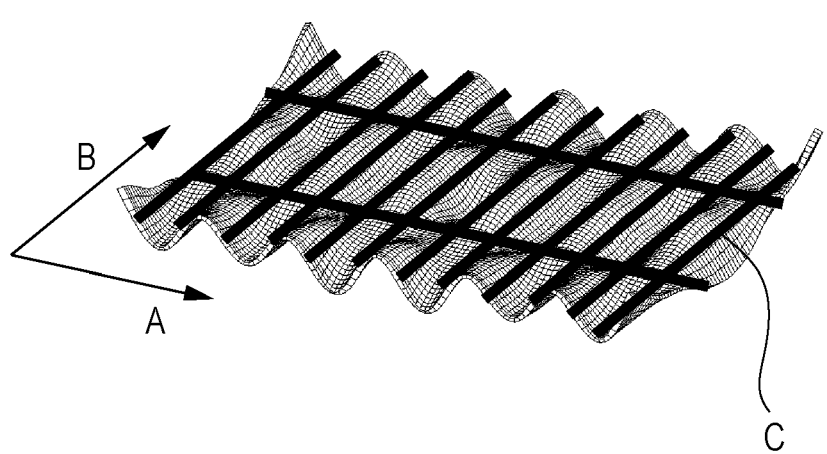
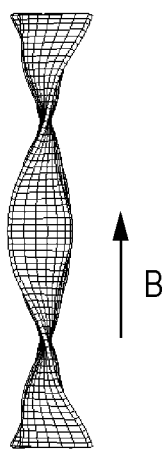

FIG. 7A

| VERTICAL POSITION | RANGE OF α(3, b) | RANGE OF β(3, b) | REGION | ALTERNATING VOLTAGE SETTING |
|---|---|---|---|---|
| NEAR UPPER END | 0.3 TO 0.5 | 23° | REGION 1 | SET FIFTH ALTERNATING VOLTAGE |
| ↑ | 0.1 TO 0.3 | 23° | REGION 2 | SET FORTH ALTERNATING VOLTAGE |
| ↑ | 0 TO 0.1 | 23° OR −157° | REGION 3 | SET THIRD ALTERNATING VOLTAGE |
| ↑ | 0.1 TO 0.3 | −157° | REGION 4 | SET SECOND ALTERNATING VOLTAGE |
| NEAR MIDDLE | 0.3 TO 0.5 | −157° | REGION 5 | SET FIRST ALTERNATING OLTAGE |
|  | 0.3 TO 0.5 | −157° | REGION 6 | SET FIRST ALTERNATING VOLTAGE |
| ↓ | 0.1 TO 0.3 | −157° | REGION 7 | SET SECOND ALTERNATING VOLTAGE |
| ↓ | 0 TO 0.1 | 23° OR −157° | REGION 8 | SET THIRD ALTERNATING VOLTAGE |
| ↓ | 0.1 TO 0.3 | 23° | REGION 9 | SET FOURTH ALTERNATING VOLTAGE |
| NEAR LOWER END | 0.3 TO 0.5 | 23° | REGION 10 | SET FIFTH ALTERNATING VOLTAGE |

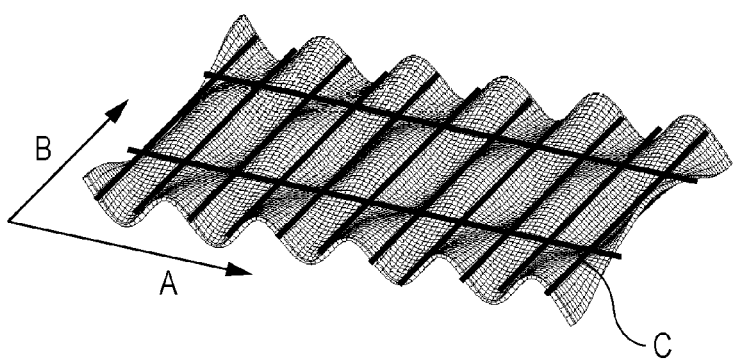

FIG. 7B

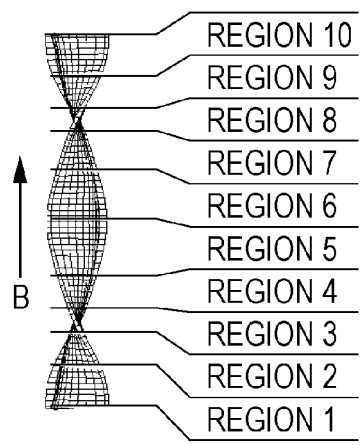

| ALTERNATING VOLTAGE SETTING | VALUE USED FOR CALCULATION FOR SETTING OF ALTERNATING VOLTAGE | | | | | | | |
|---|---|---|---|---|---|---|---|---|
| | RESPONSE OF VIBRATION IN FIRST VIBRATION MODE | | RESPONSE OF VIBRATION IN SECOND VIBRATION MODE | | RESPONSE OF VIBRATION IN THIRD VIBRATION MODE | | RESPONSE OF VIBRATION IN FOURTH VIBRATION MODE | |
| | α(1) | β(1) | α(2) | β(2) | α(3, b) | β(3, b) | α(4, b) | β(4, b) |
| SET FIRST ALTERNATING VOLTAGE | 1 | −165° | 1 | −15° | 0.4 | −157° | 0.2 | −12° |
| SET SECOND ALTERNATING VOLTAGE | 1 | −165° | 1 | −15° | 0.2 | −157° | 0.1 | −12° |
| SET THIRD ALTERNATING VOLTAGE | 1 | −165° | 1 | −15° | 0 | −157° OR 23° | 0 | −12° OR 168° |
| SET FOURTH ALTERNATING VOLTAGE | 1 | −165° | 1 | −15° | 0.2 | 23° | 0.1 | 168° |
| SET FIFTH ALTERNATING VOLTAGE | 1 | −165° | 1 | −15° | 0.4 | 23° | 0.2 | 168° |

FIG. 9A

| ALTERNATING VOLTAGE SETTING | α(10, b) | β(10, b) | α(11, b) | β(11, b) |
|---|---|---|---|---|
| SET FIRST ALTERNATING VOLTAGE | 1.40 | −162.7° | 1.20 | −14.5° |
| SET SECOND ALTERNATING VOLTAGE | 1.20 | −163.7° | 1.10 | −14.7° |
| SET THIRD ALTERNATING VOLTAGE | 1.00 | −165.0° | 1.00 | −15.0° |
| SET FOURTH ALTERNATING VOLTAGE | 0.80 | −167.0° | 0.90 | −15.3° |
| SET FIFTH ALTERNATING VOLTAGE | 0.61 | −170.3° | 0.80 | −15.8° |

FIG. 9B

| ALTERNATING VOLTAGE SETTING | V (DIFFERENCE) | θ (DIFFERENCE) | V (SUM) | θ (SUM) |
|---|---|---|---|---|
| SET FIRST ALTERNATING VOLTAGE | 71.6 | 0.0° | 83.3 | −238.2° |
| SET SECOND ALTERNATING VOLTAGE | 83.4 | 0.0° | 90.9 | −238.9° |
| SET THIRD ALTERNATING VOLTAGE | 100.0 | 0.0° | 100.0 | −240.0° |
| SET FOURTH ALTERNATING VOLTAGE | 124.6 | 0.0° | 111.1 | −241.7° |
| SET FIFTH ALTERNATING VOLTAGE | 164.9 | 0.0° | 124.9 | −244.5° |

FIG. 9C

| ALTERNATING VOLTAGE SETTING | V(1) | θ(1) | V(2) | θ(2) | ε | δ |
|---|---|---|---|---|---|---|
| SET FIRST ALTERNATING VOLTAGE | 76.1 | 68.7° | 135.5 | 148.5° | 1.781 | 79.8° |
| SET SECOND ALTERNATING VOLTAGE | 86.0 | 64.9° | 151.9 | 149.1° | 1.766 | 84.2° |
| SET THIRD ALTERNATING VOLTAGE | 100.0 | 60.0° | 173.2 | 150.0° | 1.732 | 90.0° |
| SET FOURTH ALTERNATING VOLTAGE | 121.4 | 53.7° | 202.5 | 151.1° | 1.668 | 97.4° |
| SET FIFTH ALTERNATING VOLTAGE | 158.4 | 45.4° | 246.0 | 152.7° | 1.553 | 107.3° |

FIG. 10

| LOCATION OF REGION BOUNDARY AND α(3, b) AT BOUNDARY | VALUE USED FOR CALCULATION OF VIBRATION STATE AT REGION BOUNDARY | | | | | | | |
|---|---|---|---|---|---|---|---|---|
| | RESPONSE OF VIBRATION IN FIRST VIBRATION MODE | | RESPONSE OF VIBRATION IN SECOND VIBRATION MODE | | RESPONSE OF VIBRATION IN THIRD VIBRATION MODE | | RESPONSE OF VIBRATION IN FOURTH VIBRATION MODE | |
| | α(1) | β(1) | α(2) | β(2) | α(3, b) | β(3, b) | α(4, b) | β(4, b) |
| BOUNDARY BETWEEN REGION 6 AND REGION 5 0.5 | 1 | −165° | 1 | −15° | 0.5 | −157° | 0.25 | −12° |
| BOUNDARY BETWEEN REGION 5 AND REGION 4 0.3 | 1 | −165° | 1 | −15° | 0.3 | −157° | 0.15 | −12° |
| BOUNDARY BETWEEN REGION 4 AND REGION 3 0.1 | 1 | −165° | 1 | −15° | 0.1 | −157° | 0.05 | −12° |
| BOUNDARY BETWEEN REGION 3 AND REGION 2 0.1 | 1 | −165° | 1 | −15° | 0.1 | 23° | 0.05 | 168° |
| BOUNDARY BETWEEN REGION 2 AND REGION 1 0.3 | 1 | −165° | 1 | −15° | 0.3 | 23° | 0.15 | 168° |
| LOWER END 0.5 | 1 | −165° | 1 | −15° | 0.5 | 23° | 0.25 | 168° |

FIG. 11

| LOCATION OF REGION BOUNDARY AND α(3, b) AT BOUNDARY | α(10, b) | β(10, b) | α(11, b) | β(11, b) |
|---|---|---|---|---|
| BOUNDARY BETWEEN REGION 6 AND REGION 5<br>0.5 | 1.50 | −162.3° | 1.25 | −14.4° |
| BOUNDARY BETWEEN REGION 5 AND REGION 4<br>0.3 | 1.30 | −163.2° | 1.15 | −14.6° |
| BOUNDARY BETWEEN REGION 4 AND REGION 3<br>0.1 | 1.10 | −164.3° | 1.05 | −14.9° |
| BOUNDARY BETWEEN REGION 3 AND REGION 2<br>0.1 | 0.90 | −165.9° | 0.95 | −15.16° |
| BOUNDARY BETWEEN REGION 2 AND REGION 1<br>0.3 | 0.70 | −168.4° | 0.85 | −15.5° |
| LOWER END<br>0.5 | 0.51 | −172.9° | 0.75 | −16.0° |

FIG. 12A

| ALTERNATING VOLTAGE SETTING | CORRESPONDING REGION | $\alpha(3, b)$ AT BOUNDARY | X(10, b) | $\phi$(10, b) | X(11, b) | $\phi$(11, b) |
|---|---|---|---|---|---|---|
| SET FIRST ALTERNATING VOLTAGE | REGION 5 | 0.5 | 107.1 | −162.3° | 104.2 | −252.6° |
| | REGION 6 | 0.3 | 92.9 | −163.2° | 95.8 | −252.8° |
| SET SECOND ALTERNATING VOLTAGE | REGION 4 | 0.3 | 108.3 | −163.2° | 104.5 | −253.6° |
| | REGION 7 | 0.1 | 91.7 | −164.3° | 95.5 | −253.8° |
| SET THIRD ALTERNATING VOLTAGE | REGION 3 | 0.1 | 109.9 | −164.3° | 105.0 | −254.9° |
| | REGION 8 | 0.1 | 90.1 | −165.9° | 95.0 | −255.2° |
| SET FOURTH ALTERNATING VOLTAGE | REGION 2 | 0.1 | 112.3 | −165.9° | 105.5 | −256.8° |
| | REGION 9 | 0.3 | 87.8 | −168.4° | 94.5 | −257.2° |
| SET FIFTH ALTERNATING VOLTAGE | REGION 1 | 0.3 | 116.1 | −168.4° | 106.2 | −260.1° |
| | REGION 10 | 0.5 | 84.0 | −172.9° | 93.8 | −260.5° |

FIG. 12B

| ALTERNATING VOLTAGE SETTING | CORRESPONDING REGION | $\alpha(3, b)$ AT BOUNDARY | X(10, b)/X(11, b) | $\phi$(10, b) − $\phi$(11, b) |
|---|---|---|---|---|
| SET FIRST ALTERNATING VOLTAGE | REGION 5 | 0.5 | 1.03 | 90.3° |
| | REGION 6 | 0.3 | 0.97 | 89.6° |
| SET SECOND ALTERNATING VOLTAGE | REGION 4 | 0.3 | 1.04 | 90.4° |
| | REGION 7 | 0.1 | 0.96 | 89.5° |
| SET THIRD ALTERNATING VOLTAGE | REGION 3 | 0.1 | 1.05 | 90.6° |
| | REGION 8 | 0.1 | 0.95 | 89.3° |
| SET FOURTH ALTERNATING VOLTAGE | REGION 2 | 0.1 | 1.06 | 90.9° |
| | REGION 9 | 0.3 | 0.93 | 88.8° |
| SET FIFTH ALTERNATING VOLTAGE | REGION 1 | 0.3 | 1.09 | 91.7° |
| | REGION 10 | 0.5 | 0.90 | 87.6° |

VIBRATING APPARATUS, DRIVING APPARATUS HAVING THE VIBRATING APPARATUS, AND OPTICAL DEVICE

BACKGROUND OF THE INVENTION

1. Field of the Invention

One disclosed aspect of the embodiments relates to a vibrating apparatus, driving apparatus having the vibrating apparatus, and optical device. Particularly, one embodiment relates to an optical device such as a camera, facsimile, scanner, projector, photocopier, laser printer, inkjet printer, lens, binoculars, image display devices, and so forth. Also, one embodiment relates to an vibrating device used for a dust removal apparatus for such an optical device, and a driving device to drive a driven member by vibrating.

2. Description of the Related Art

In imaging apparatuses in recent years, resolution of optical sensors has improved markedly, and accordingly dust that adheres to the optical system during use has influenced imaged images.

In particular, resolution of imaging devices that are video cameras and still cameras has been significantly improving, whereby when dust adheres to the optical device that is disposed on the optical path near the imaging device, image defects may occur.

For example, when dust from the outside or abrasion powder generated from internal mechanical surfaces in sliding contact adheres to an infrared-cut filter, an optical low-pass filter, or the like, the image on the imaging device face has little blurring so the dust may show up in the imaged image.

On the other hand, imaging units such as copier, facsimile, scanner, or the like read a flat document by scanning a line sensor or by scanning a document that is placed near a line sensor.

When dust adheres to the light beam incident portion towards the line sensor, the dust may show up on the scanned image.

Also, with a method for so-called scan-reading where a document is read during transport from a device with a method to scan a document, a reading portion of a facsimile, or an automated document sending device of a photocopier, there are cases where one piece of dust may show up as a continuous line image in the document sending direction.

Thus, a problem occurs in that image quality is significantly lost.

Image quality may be recovered by wiping away the dust by hand, but the dust adhered during use has to be confirmed after photographing.

In the meantime, the image of dust shows up on the photographed or scanned image, so corrections have to be made by image processing with software, and a photocopier outputs the image to paper media at the same time so correction takes much work.

To address such problems, with the related art, a dust removal apparatus that moves dust from the image reading portion by applying vibrations, and optical devices having the dust removal apparatus installed therein have been proposed (see Japanese Patent Laid-Open No. 2008-207170).

FIG. 13A is a diagram illustrating a configuration of a vibration apparatus of a dust removal apparatus with the related art which is disclosed in Japanese Patent Laid-Open No. 2008-207170. A vibration apparatus 300 is provided to an imaging device 301 that converts the received subject image into electrical signals and creates image data. Space in front of the front face of the imaging device 301 is sealed off by the vibration apparatus 300 and imaging device 301. That is to say, the vibration apparatus 300 is joined to the front face side of the imaging device 301 so as to seal off the space via a sealing member or the like. The vibration apparatus 300 is made up of an optical device 302 having a rectangular plate shape and a pair of piezoelectric elements 303a and 303b which are electromechanical energy conversion devices that are fixed to both sides of the optical device 302 by an adhesive. An alternating voltage Va is applied to the piezoelectric element 303a as a driving voltage, and an alternating voltage Vb is applied to the piezoelectric element 303b as a driving voltage.

The label A in FIG. 13B indicates a displacement distribution of a primary out-of-plane bending vibration (standing wave), and the label B indicates a displacement distribution of a secondary out-of-plane bending vibration (standing wave). The vertical axis shows the direction of the imaging device 301 side to be negative, with a displacement of the out-of-plane direction of the front face on the opposite side from the side where the imaging device 301 of the vibration apparatus 300 is disposed. The horizontal axis corresponds to the position in the lengthwise direction of the vibration apparatus 300 as illustrated in the diagram. The alternating voltage Va and alternating voltage Vb together are a cyclic alternating voltage that has a response to the resonance phenomenon of the primary out-of-plane bending vibration and secondary out-of-plane bending vibration, and further the alternating voltage Va and alternating voltage Vb have difference temporal phases. Thus, a combined vibration, where the two vibrations of the primary out-of-plane bending vibration and secondary out-of-plane bending vibration having different temporal phases are synthesized, is excited in the vibration apparatus 300.

FIGS. 14 through 17 are graphs illustrating, for each time phase, the primary out-of-plane bending vibration and secondary out-of-plane bending vibration in the case that the two vibrations have temporal phase difference of 90° and an amplitude of 1:1, and the displacement and displacement speed of the vibrating bodies having these vibrations overlapping with each other. The vertical axis shows the displacement and displacement speed with the direction of the imaging device 301 side to be negative. The horizontal axis corresponds to the position in the lengthwise direction of the vibration apparatus 300, similar to FIG. 13B.

In the diagrams, waveform C indicates a displacement of the primary out-of-plane bending vibration. Waveform D indicates a displacement of the secondary out-of-plane bending vibration. Waveform E indicates displacement of the vibration apparatus 300 having the two vibrations overlapping with each other. Waveform G indicates displacement of the vibration apparatus 300 at a time phase 30° before the waveform E. Waveform F indicates displacement speed that has been normalized by the vibration apparatus 300. In the case that the dust removal apparatus is operated, the dust that is adhered to the surface of the optical device 302 is moved so as to be pulled by force of the normal direction of the surface of the optical device 302 when the optical device 302 pushes up the dust towards the out-of-plane direction (the positive direction of the vertical axis in FIGS. 14 through 17).

That is to say, in each time phase, when the value of the waveform F indicating displacement speed is positive, the dust is pushed up in the out-of-plane direction, receives force in the normal direction of the waveform E which indicates the displacement of the vibration apparatus 300 in the time phase therein, and the dust is moved. In the case that the displacement is provided while the optical device 302 is standing at a defined angle (typically, vertical), in the case that the dust adhered to the surface of the optical device 302 receives force in the normal direction of the surface of the optical device 302 and drawn, the dust does not adhere again, with a constant probability, and falls due to gravity.

The arrow h in FIGS. 14 through 17 illustrate the direction that the dust moves. In viewing FIGS. 14 through 17, from position 60 to 300 of the optical device 302, the amount of vibration to move the dust in the positive direction of the horizontal axis is relatively greater than the amount of vibration to move dust in the negative direction. Therefore, the dust may be moved in the positive direction of the horizontal axis. In the case that the effective portion of the optical device 302 as to the imaging device 301 (also called optical effective portion) is in the range of position 60 through position 300, the dust may be removed from the effective portion. Now, in the case that an optical device is disposed in the light path of the imaging device, the light entering the imaging device means the range which passes through the optical device.

SUMMARY OF THE INVENTION

However, the vibration apparatus described above has problems to be resolved as described below. With the driving apparatus 300 according to Japanese Patent Laid-Open No. 2008-207170, there are a large number of vibration modes near the resonance frequency of the two vibration modes used for driving. If the vibrations near the resonance frequency is excited in order to make the vibration modes used for driving to be larger, other unnecessary vibration modes may also respond (also called excite or vibrate).

At a joint position having no amplitude in an unnecessary vibration mode (a position that is not displaced), influence from vibrations in unnecessary vibration modes are not received, and may realize a favorable vibration state. However, in other positions, influence from vibrations in unnecessary vibration modes may be received, whereby the amplitude distribution and phase distribution may be distorted.

Thus, there may be cases wherein a position where the direction of the inner-facing direction, when tapping up (also called pushing up) the dust (driven target) on the front face of the optical device 302, results in an inverse direction, or a position where the components in the inner-facing direction are small, may occur.

Thus, in the case of a vibration state that differs from the design thereof, depending on the position, there may be cases where the moving direction of the inner faces are facing one another and so the dust cannot move, or that the movement force is small compared to the adhesive force of the dust and so the efficiency of moving the dust is reduced.

An embodiment provides a vibration apparatus, a driving apparatus having the vibration apparatus, a dust removing device, and an optical device, which may efficiently move a driving target, including dust, in a predetermined direction, but using a driving method that considers the vibration response of unnecessary vibration modes.

An embodiment relates to a vibrating body comprising an electromechanical energy converting element having an electrode, the electromechanical energy converting element comprising a piezoelectric material having a lead content of less than 1000 ppm; and a control unit that generates a combined vibration by generating multiple stable waves having mutually different orders with a time phase difference by applying at least two driving voltages to the electromechanical energy converting element; wherein the control unit changes at least one of the voltage amplitude ratio and time phase difference of at least the two driving voltages, so as to change the amplitude distribution of the combined vibration.

Further features of the disclosure will become apparent from the following description of exemplary embodiments with reference to the attached drawings.

BRIEF DESCRIPTION OF THE DRAWINGS

FIG. 4 is a diagram illustrating the correlation between nodal lines of the first vibration mode and second vibration mode, and the disposal and electrode patterns of the piezoelectric elements.

FIG. 6A-1 is a perspective diagram of a distorted shape of an optical device in a third vibration mode, and FIG. 6A-2 is a diagram seen from a first direction A. Also, FIG. 6B-1 is a perspective diagram of a distorted shape of an optical device in a fourth vibration mode, and FIG. 6B-2 is a diagram seen from the first direction A.

FIG. 7A is a diagram illustrating the correlation between ranges that define regions, regions, and settings for alternating voltages. Also, FIG. 7B is a perspective diagram of a distorted shape of an optical device in the third vibration mode, and FIG. 7C is a diagram seen from the first direction A and illustrates the disposal of regions.

FIG. 8 is a diagram illustrating the values of vibration response of the vibrations in the first through fourth vibration modes used to calculate the settings of each alternating voltage.

FIG. 9A is a diagram illustrating values of a vibration response of tenth order and eleventh order vibrations used for the settings of each alternating voltage. Also, FIG. 9B is a diagram illustrating the size and phase of vibrating voltage, and FIG. 9C is a diagram illustrating the size and phase of alternative voltages and the voltage amplitude ratios and time phase differences thereof.

FIG. 10 is a diagram illustrating the values of response of the vibrations of the first through fourth vibration modes used in calculating vibrating states at region borders.

FIG. 11 is a diagram illustrating the values of response of the vibrations of the tenth order and eleventh order vibrations used in calculating vibrating states at region borders.

FIG. 12A is a diagram illustrating vibrating states at region borders. FIG. 12B is a diagram illustrating the values of amplitude ratios and time phase differences of the tenth order and eleventh order vibrations in vibrating states.

DESCRIPTION OF THE EMBODIMENTS

An embodiment is related to a vibration apparatus, where at least two driving voltages are set so as to take into consideration the vibration responses in unnecessary vibration modes as described above, and where changes are made to at least one of the voltage amplitude ratio and time phase difference of the driving voltages.

With the present embodiment, the term "vibrating body" refers to an integrated unit made of joining an optical element which is an elastic body and a piezoelectric element by an adhesive material.

An embodiment provides a vibration apparatus having a configuration described below, and a driving apparatus and dust removing device and optical device having the vibration apparatus. Examples of the embodiments will be further described below, but the disclosure is not to be limited by these.

First Embodiment

Figure 1:
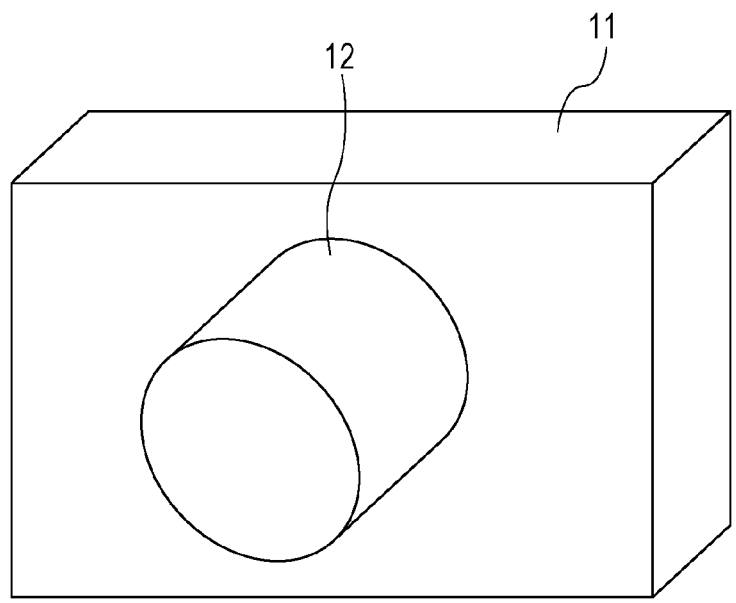
FIG. 1 is a diagram of a camera.

FIG. 1 is a camera which is an optical device. The numeral 11 denotes a camera main unit, and the numeral 12 denotes a lens housing.

A configuration example of a vibration apparatus installed on a camera according to a first embodiment will be described with reference to FIG. 2.

The vibration apparatus according to the present embodiment functions as a dust removing device that moves and removes the dust. Also, the dust removing device is disposed on the light path of the optical device.

Figure 2:
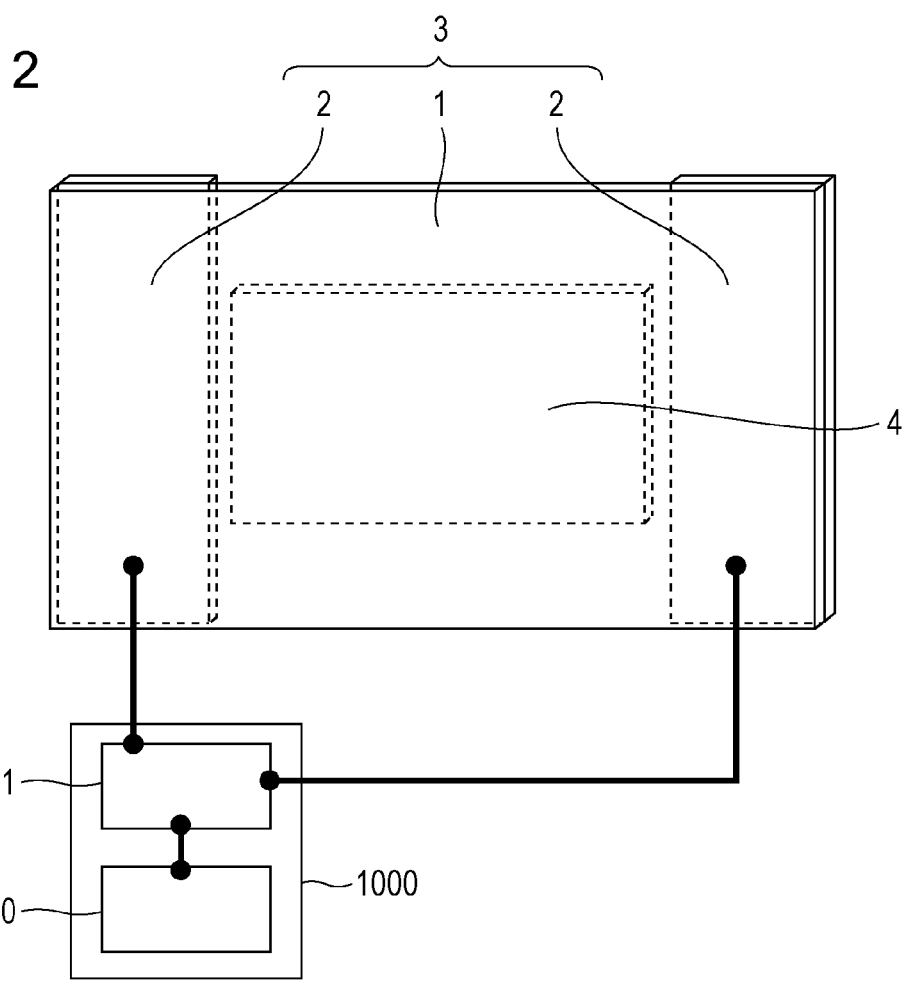
FIG. 2 is a diagram of a vibration apparatus.

In FIG. 2, reference numeral 1 denotes an optical element, to which piezoelectric elements 2 (2a and 2b) which are two electromechanical energy conversion devices are fixed by an adhesive on the same side as the imaging device 4. However, the number of piezoelectric elements is not limited to two; at least one is needed. In the case of one piezoelectric element, an individual electrode is provided on the piezoelectric element thereof, and different driving voltages may be applied to each electrode. Also, the piezoelectric element according to the present embodiment has piezoelectric material of which the amount of lead contained is less than 1000 ppm, and an electrode. Details of the piezoelectric material will be described later.

A control circuit 100 sets the frequency, voltage value, and time phase of the alternating voltage serving as the driving voltage emitting from a power source 101. The power source 101 is electrically connected to the piezoelectric elements 2a and 2b. A control unit 1000 is made up of the control circuit 100 and power source 101. According to the present embodiment, there may be at least two driving voltages.

A vibrating body 3 is made up of the optical element 1 and piezoelectric elements 2. The vibrating body 3 is attached to an imaging device 4 so that the space at the front face of the imaging device 4 which is a light-receiving device is sealed off. The light from the subject passes through the optical device 1, and enters the imaging device 4. The range where the light entering the imaging device at this time transmits the optical device 1 is an optical effective unit 5.

According to the present embodiment, two out-of-plane bending vibrations (standing waves) having different orders, of which nodal lines are arrayed in the same direction, are provided with a time phase difference and excited, whereby a combined vibration of two out-of-plane bending vibrations having been combined is generated. The nodal lines refer to virtual lines that are formed in the event that portions serving as connections of the standing wave are connected in the case that vibrations are applied to a predetermined face of a vibration target which is an elastic body (e.g., optical device), and a standing wave is generated on the face of the vibration target.

According to the present embodiment, the control circuit 100 sets the frequency of the driving voltage generated by the power source 101 so that nodal lines are arrayed in the left/right direction on the paper (first direction, A in the diagrams) and responses are made to both the out-of-plane tenth order bending vibration mode (first vibration mode) and out-of-plane eleventh order vibration mode (second vibration mode), and both responses have approximately the same frequency. Now, "responses are made" means that the vibration is excited or that a vibration occurs.

Figure 3A:
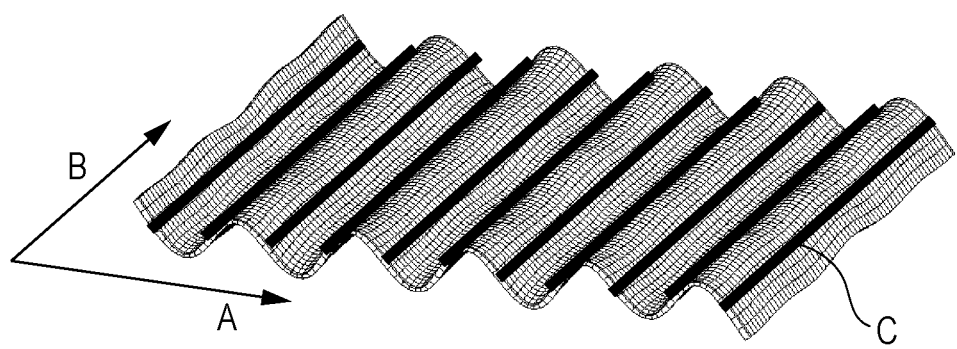
FIG. 3A is a perspective diagram of a distorted shape of an optical device in a first vibration mode.
Figure 3B:
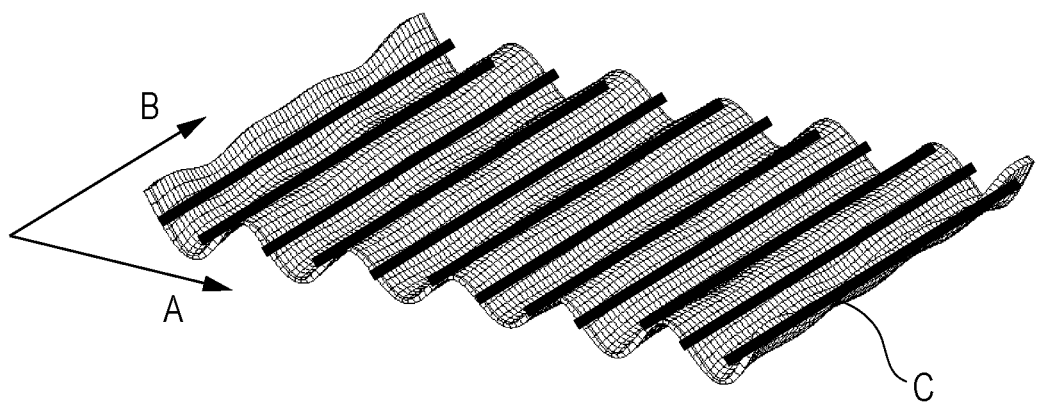
FIG. 3B is a perspective diagram of a distorted shape of an optical device in a second vibration mode.

FIG. 3A is a perspective diagram of a distorted shape the an optical device 1 in the first vibration mode, and FIG. 3B is a perspective diagram of a distorted shape of the optical device 1 in the second vibration mode. In FIGS. 3A and 3B, A denotes a first direction and B denotes a second direction which intersects with the first direction.

According to the present embodiment, the first direction A and second direction B are orthogonal to one another. C denotes a nodal line in a vibration mode. The first vibration mode and second vibration mode have multiple nodal lines that are arrayed in the first direction A. Also, the number of nodal lines arrayed in the first direction A is 11 in the first vibration mode and 12 in the second vibration mode, differing from one another. The first vibration mode has fewer orders of out-of-plane bending distortions than the second vibration mode, and the wavelength is longer, whereby the number of unique vibrations is less than in the second vibration mode.

The control circuit 100 sets the time phase difference of two driving voltages that are generated by the power source 101. Thus, the out-of-plane tenth order bending vibration mode (first vibration mode) and out-of-plane eleventh order vibration mode (second vibration mode) are generated to the vibrating body 3 at different time phases.

Regarding the combined vibrations herein, the directions of the out-of-plane direction at the time of pushing up the driven target such as dust are approximately the same in almost all of the regions on the surface of the optical device 1. Therefore, force may be applied in one direction within the plane of all of the driven targets that are moved by the vibrations, whereby movement in one direction may be realized.

Correlation between nodal lines of the out-of-plane tenth order bending vibration mode (first vibration mode) and out-of-plane eleventh order vibration mode (second vibration mode), and the disposal and electrode patterns of each piezoelectric element 2, will be described with reference to FIG. 4.

Plot 6 illustrates the displacement distribution of the first vibration mode excited in the vibrating body 3 (denoted by 7 in the diagram) and the displacement distribution of the second vibration mode (denoted by 8 in the diagram). The vertical axis represents displacement in the out-of-plane direction of the optical device 1, and the opposite side from the side where the imaging device 4 is disposed is positive. The horizontal axis corresponds to the position in the left/right direction of the optical device 1 in the diagram. Also, according to the present embodiment, a neutral plane in the bending of the two vibrations is within the optical device 1.

Expanding/contracting distortions occur in the left/right direction in the piezoelectric element 2 which is disposed at a positive location of the displacement, and expanding/contracting distortions occur in the left/right direction of the opposite phase (180°) in the piezoelectric element 2 which is disposed at a negative location of the displacement. The piezoelectric elements 2a and 2b on both left and right ends are in a rectangular plate shape, and are disposed from the end of the optical device 1 to the optical effective range 5 in the left/right direction (first direction A), and are disposed up to both ends of the optical device 1 in the up/down direction (second direction B).

The piezoelectric elements 2a and 2b have uniform electrodes over the entire back face that is joined to the optical device 1, and have electrodes that are divided into multiple electrodes (hereinafter, divided electrodes 9) on the front face of the opposite face.

The divided locations of the divided electrodes 9, as the correlation is illustrated in the diagram by broken lines, are at positions between a location of a joint where the displacement in the displacement distribution 7 in the first vibration mode is roughly 0, and a location of a joint where the displacement in the displacement distribution 8 in the second vibration mode is roughly 0.

At the time of the electrode dividing, the electrode on the back face is the grounding potential, and potential of a different polarity from the adjoining electrode is applied to the divided electrode 9 on the front face as illustrated by + and − in the diagram. The divided electrode of the piezoelectric element 2a on the left is given polarity of + − + − from the left end, and the piezoelectric element 2b on the right is given polarity of + − + − from the right end. The dividing direction is the thickness direction of the piezoelectric element 2, and is the orthogonal direction on paper in FIG. 4.

After the electrode dividing, a conductive coating 10 having conductivity is provided so as to cross over the divided electrode 9, and voltage is applied to one of the locations of the divided electrode 9, whereby all of the divided electrodes 9 of one piezoelectric element 2 will have the same potential.

The piezoelectric element 2 has a feature which, upon polarity of the same potential as the polarity of the potential at time of the electrode dividing being provided, a force is generated that stretches in the orthogonal direction as to the electrode dividing direction, and shrinks when a different polarity from the polarity at the time of electrode dividing is provided. In the event that alternating voltage is applied, cyclic stretching force that matches the cycle of the alternating voltage is generated. Also, according to the polarity at the time of electrode dividing, the phase (0° or 180°) of stretching force as to the alternating voltage is determined.

The driving voltage $E(1)=V(1) \times COS(2\pi ft)$ which is the alternating voltage is applied to the piezoelectric element 2a on the left. The driving voltage $E(1)$ is a first driving voltage according to the present embodiment, where $V(1)$ represents the size (amplitude) of the voltage, f represents frequency, and t represents time. The driving voltage $E(2)=V(2) \times COS(2\pi ft+\delta \times \pi/180)$, which is the alternating voltage in which the time phase differs by $\delta$ in order increments, is applied to the piezoelectric element 2b on the right. The driving voltage $E(2)$ is a second driving voltage according to the present embodiment, where $V(2)$ represents the size (amplitude) of the voltage.

At this time, the voltage that is primarily provided to the out-of-plane tenth order bending vibration mode (first vibration mode 7) in which the piezoelectric elements 2a and 2b have opposite phases is the E(difference) where the components of the difference between the driving voltages $E(1)$ and $E(2)$ are divided into the piezoelectric elements 2a and 2b on the left and right, which is defined as $E(\text{difference})=E(1)/2-E(2)/2$.

On the other hand, the voltage that is primarily provided to the out-of-plane eleventh order bending vibration mode (second vibration mode 8) in which the piezoelectric elements 2a and 2b have the same phase is the E(sum) where the components of the sum of the driving voltages $E(1)$ and $E(2)$ are divided into the piezoelectric elements 2a and 2b on the left and right, which is defined as $E(\text{sum})=E(1)/2+E(2)/2$.

Now, the phase of the stretching force that is generated by the piezoelectric element 2 from the E(difference) will be described, with E(difference) as the phase standard. The distribution of the phases of the stretching force of the piezoelectric element 2a on the left is 0°, 180°, 0°, 180° from the left end, corresponding to the divided electrode 9. The piezoelectric element 2b on the right is 180°, 0°, 180°, 0° from the right end. The distribution of the phases of stretching force herein roughly matches the distribution of the phases of stretching distortion of the piezoelectric element 2 from the distortion distribution 7 of the out-of-plane tenth order bending vibration mode (first vibration mode). Therefore, large vibrations may be obtained from the out-of-plane tenth order bending vibration mode (first vibration mode).

On the other hand, the distribution of phases of the stretching force roughly matches the displacement distribution 8 of the out-of-plane eleventh order bending vibration mode (second vibration mode), with piezoelectric element 2a on the left, and is roughly inverse with the piezoelectric element 2b on the right. With the out-of-plane eleventh order bending vibration mode (second vibration mode) from the E(difference), the vibrations excited by the piezoelectric element 2a on the left and the vibrations excited by the piezoelectric element 2b on the right are the same size and opposite phases, whereby these cancel each other out and the size becomes roughly zero. Therefore, vibrations in the out-of-plane eleventh order bending vibration mode (second vibration mode) do not occur in E(difference). Also, with another vibration mode having a different number of joints in the left/right direction from the out-of-plane tenth order bending vibration mode (first vibration mode), the distortion phase distribution differs from the phase distribution of the stretching force, and by the vibration cancelling-out effect, vibrations may be reduced.

Next, the phase of the stretching force that is generated by the piezoelectric element 2 from the E(sum) will be described, with E(sum) as the phase standard. The distribution of the phases of the stretching force of the piezoelectric element 2a on the left is 0°, 180°, 0°, 180° from the left end, corresponding to the divided electrode 9. Similarly, the piezoelectric element 2b on the right is 0°, 180°, 0°, 180° from the right end.

The distribution of the phases of stretching force herein roughly matches the distribution of the phases of stretching distortion of the piezoelectric element 2 from the distortion distribution 8 of the out-of-plane eleventh order bending vibration mode (second vibration mode). Therefore, large vibrations may be obtained from the out-of-plane eleventh order bending vibration mode (second vibration mode).

The distribution of phases of the stretching force roughly matches the displacement distribution 7 of the out-of-plane tenth order bending vibration mode (first vibration mode), with piezoelectric element 2a on the left, and is roughly inverse with the piezoelectric element 2b on the right. With the out-of-plane tenth order bending vibration mode (first vibration mode) from the E(sum), the vibrations excited by the piezoelectric element 2a on the left and the vibrations excited by the piezoelectric element 2b on the right are the same size and opposite phases, whereby these cancel each other out and the size becomes roughly zero. Therefore, vibrations in the out-of-plane tenth order bending vibration mode (first vibration mode) do not occur in E(sum). Also, with another vibration mode having a different number of joints in the left/right direction from the out-of-plane eleventh order bending vibration mode (second vibration mode), the distortion phase distribution differs from the phase distribution of the stretching force, and by the vibration cancelling-out effect, vibrations may be reduced.

Now, the relation between the vibrations in the first vibration mode and vibrations in the second vibration mode and the driving voltage E(1) and driving voltage E(2) will be described again, in addition to the above-described vibration exciting voltage E(difference) and vibration exciting voltage E(sum), with consideration of vibration responses (response amplitude gain and response phase).

Let us say that the response amplitude gain of the vibration response in the first vibration mode as to the vibration exciting voltage E(difference) is $\alpha(1)$, and the response phase is $\beta(1)$. Similarly, let us say that the response amplitude gain of the vibration response in the second vibration mode as to the vibration exciting voltage E(sum) is $\alpha(2)$, and the response phase is $\beta(2)$. The response amplitude gains $\alpha(1)$ and $\alpha(2)$ are values computed at locations having the maximum displacement within the displacement distribution of the first and second vibration modes illustrated in FIG. 4. The locations of the maximum amplitude herein are one location for each wavelength, and at these positions have the same amplitude values.

The distribution of response phases in each vibration mode has a fixed value at locations where the displacement is positive. Also, distribution of response phases in each vibration mode has a fixed value at locations where the displacement is negative, and has an inverse phase that differs by 180° as to the response phase of the positive locations. The response phases $\beta(1)$ and $\beta(2)$ are values that the response phases are computed at locations where the displacement is positive.

$\alpha(1)$, $\alpha(2)$, $\beta(1)$, and $\beta(2)$ are measured using a laser Doppler vibration gauge or the like, and become known numbers. Also, now, the sizes of the driving voltage E(1), driving voltage E(2), vibration exciting voltage E(difference), and vibration exciting voltage E(sum) are denoted, in order, as V(1), V(2), V(difference), and V(sum), and the time phases are denoted in order, as $\theta(1)$, $\theta(2)$, $\theta$(difference), and $\theta$(sum).

For the vibrations in the first vibration mode, V(difference) and $\theta$(difference) for size X(1) and time phase $\phi(1)$ are found as in Expressions (1) and (2) below. The size X(1) is the value of the amplitude at the location of maximum displacement within the displacement distribution in the first vibration mode. The time phase $\phi(1)$ is the value of the response phase at a location where the displacement is positive.

$$V(\text{difference}) = X(1)/\alpha(1) \qquad \text{Expression (1)}$$

$$\theta(\text{difference}) = \phi(1) - \beta(1) \qquad \text{Expression (2)}$$

Similarly, for the vibrations in the second vibration mode, the V(sum) and $\theta$(sum) for size X(2) and time phase $\phi(2)$ are found as in Expressions (3) and (4) below. The size X(2) is the value of the amplitude at the location of maximum displacement within the displacement distribution in the second vibration mode. The time phase $\phi(2)$ is the value of the response phase at a location where the displacement is positive.

$$V(\text{sum}) = X(2)/\alpha(2) \qquad \text{Expression (3)}$$

$$\theta(\text{sum}) = \phi(2) - \beta(2) \qquad \text{Expression (4)}$$

Also, the driving voltage E(1) is the result of E(difference) added to E(sum), and E(2) is the result of E(difference) subtracted from E(sum), and V(1), $\theta(1)$, V(2), and $\theta(2)$ may be found as in Expressions (5) through (8) below.

$$V(1) = [\{V(\text{sum}) \times \cos\theta(\text{sum}) + V(\text{difference}) \times \cos\theta(\text{difference})\}^2 + \{V(\text{sum}) \times \sin\theta(\text{sum}) + V(\text{difference}) \times \sin\theta(\text{difference})\}^2]^{0.5} \qquad \text{Expression (5)}$$

$$\theta(1) = \text{TAN}^{-1}[\{V(\text{sum}) \times \sin\theta(\text{sum}) + V(\text{difference}) \times \sin\theta(\text{difference})\}/\{V(\text{sum}) \times \cos\theta(\text{sum}) + V(\text{difference}) \times \cos\theta(\text{difference})\}] \qquad \text{Expression (6)}$$

$$V(2) = [\{V(\text{sum}) \times \cos\theta(\text{sum}) - V(\text{difference}) \times \cos\theta(\text{difference})\}^2 + \{V(\text{sum}) \times \sin\theta(\text{sum}) - V(\text{difference}) \times \sin\theta(\text{difference})\}^2]^{0.5} \qquad \text{Expression (7)}$$

$$\theta(2) = \text{TAN}^{-1}[\{V(\text{sum}) \times \sin\theta(\text{sum}) - V(\text{difference}) \times \sin\theta(\text{difference})\}/\{V(\text{sum}) \times \cos\theta(\text{sum}) - V(\text{difference}) \times \cos\theta(\text{difference})\}] \qquad \text{Expression (8)}$$

According to the present embodiment, in order to more effectively move dust or the like (all objects that may be moved by vibration), the vibrations of the first vibration mode and the vibrations of the second vibration mode may be the same size, and the time phase difference may be 90°. That is to say, the conditions are X(1)=X(2)=X(0), $\phi(1)-\phi(2)=90°$. X(0) is the size of amplitude to be set beforehand, considering the moving state of the object to be moved. V(1), V(2), $\theta(1)$, and $\theta(2)$ which satisfy these conditions may be found using Expressions (1) through (8).

In order to multiply X(0) by $\gamma$ times, V(1) and V(2) may be both made $\gamma$ times larger, and the voltage amplitude ratio $\in = V(2)/V(1)$ of the V(1) and V(2) does not change. Also, if $\theta(1)$ is used as the time phase standard, the time phase difference $\delta$ becomes $\delta = \theta(2) - \theta(1)$. That is to say, in order to more effectively move dust or the like, the voltage amplitude ratio $\in$ and time phase difference $\delta$ may be computed using Expressions (1) through (8), Expression (9) which is X(1)=X(2), and Expression (10) which is $\phi(1)-\phi(2)=90°$.

Figure 5A:
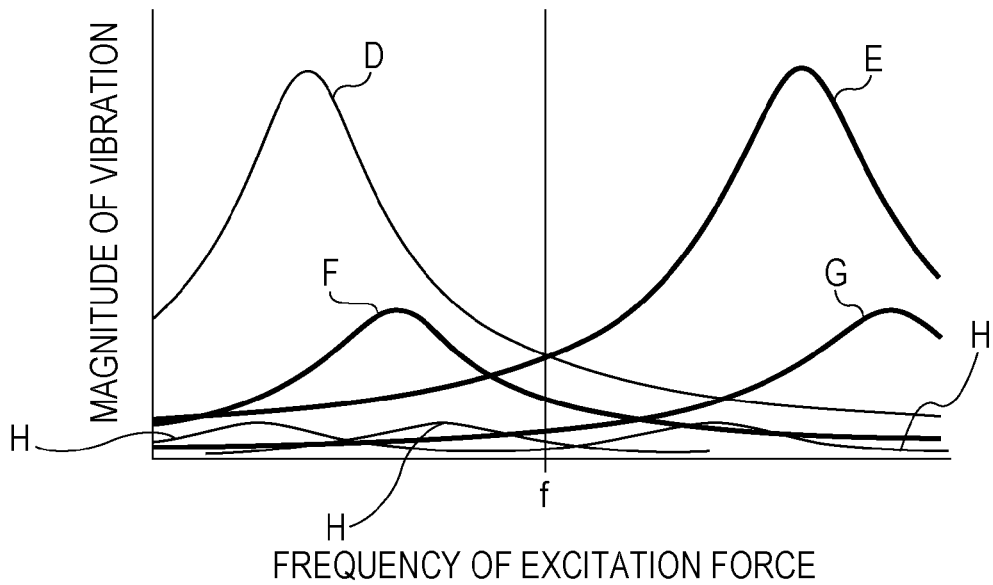
FIG. 5A is a diagram illustrating the vibration exciting voltage frequency and the response gain of vibrations in each vibration mode for each unit of voltage.
Figure 5B:
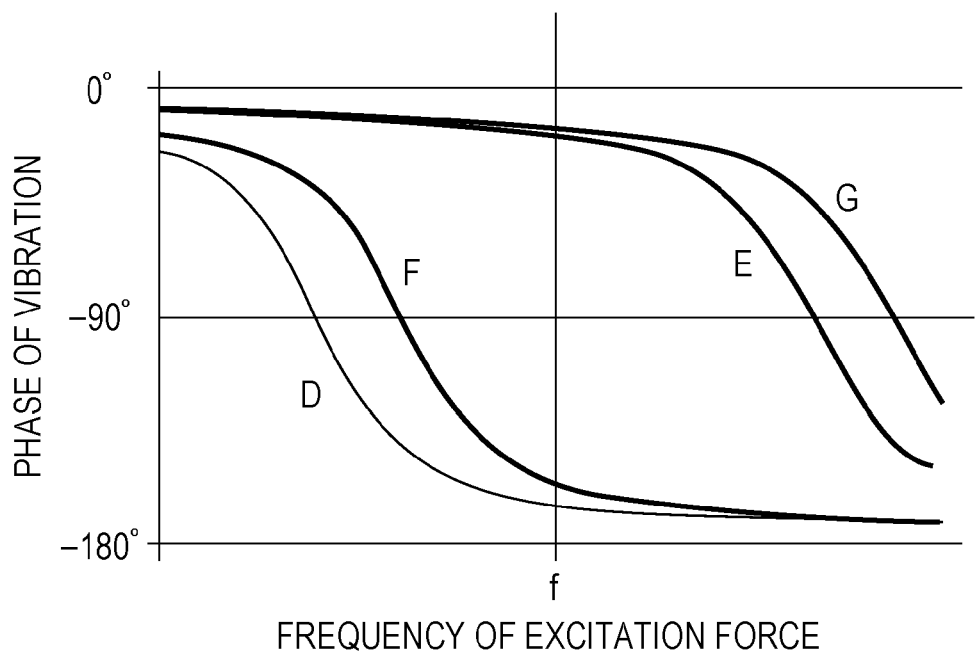
FIG. 5B is a diagram illustrating the vibration exciting voltage frequency and the response phase of vibrations in each vibration mode.
Figure 13A:
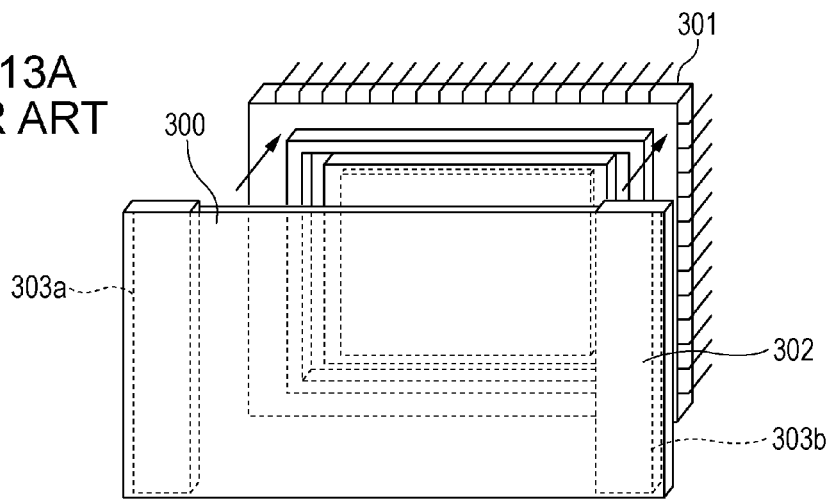
FIG. 13A is a diagram illustrating a configuration of a prior art vibrating apparatus.
Figure 13B:
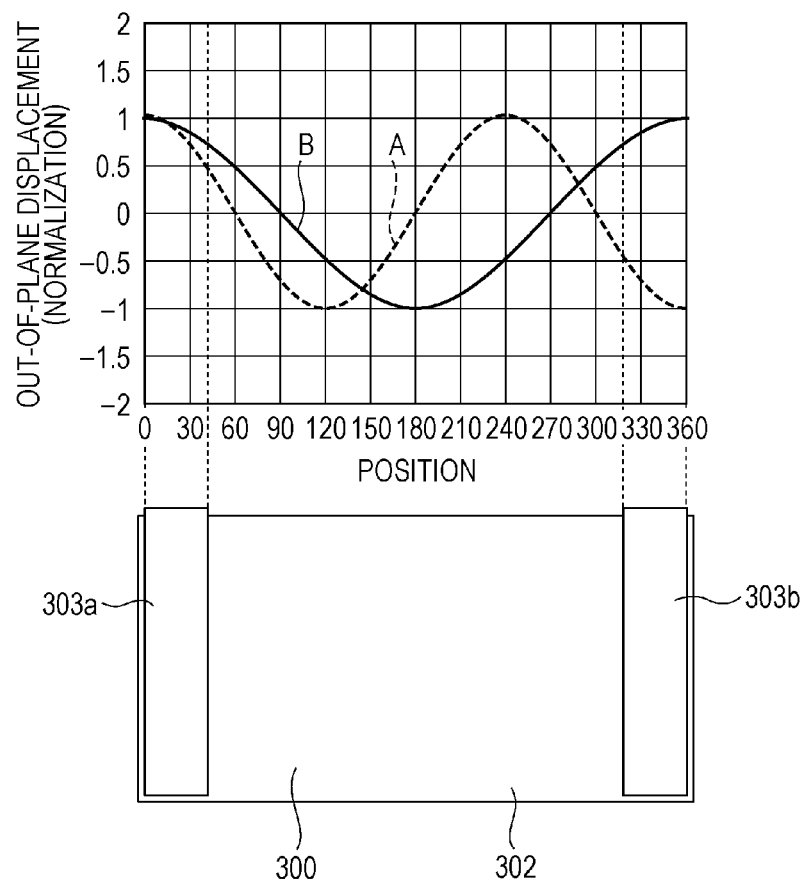
FIG. 13B is a diagram illustrating the displacement distribution of the out-of-plane primary bending vibration and out-of-plane secondary bending vibration of the vibrating body of the prior art vibrating apparatus, and the disposal of the piezoelectric elements.
Figure 14:
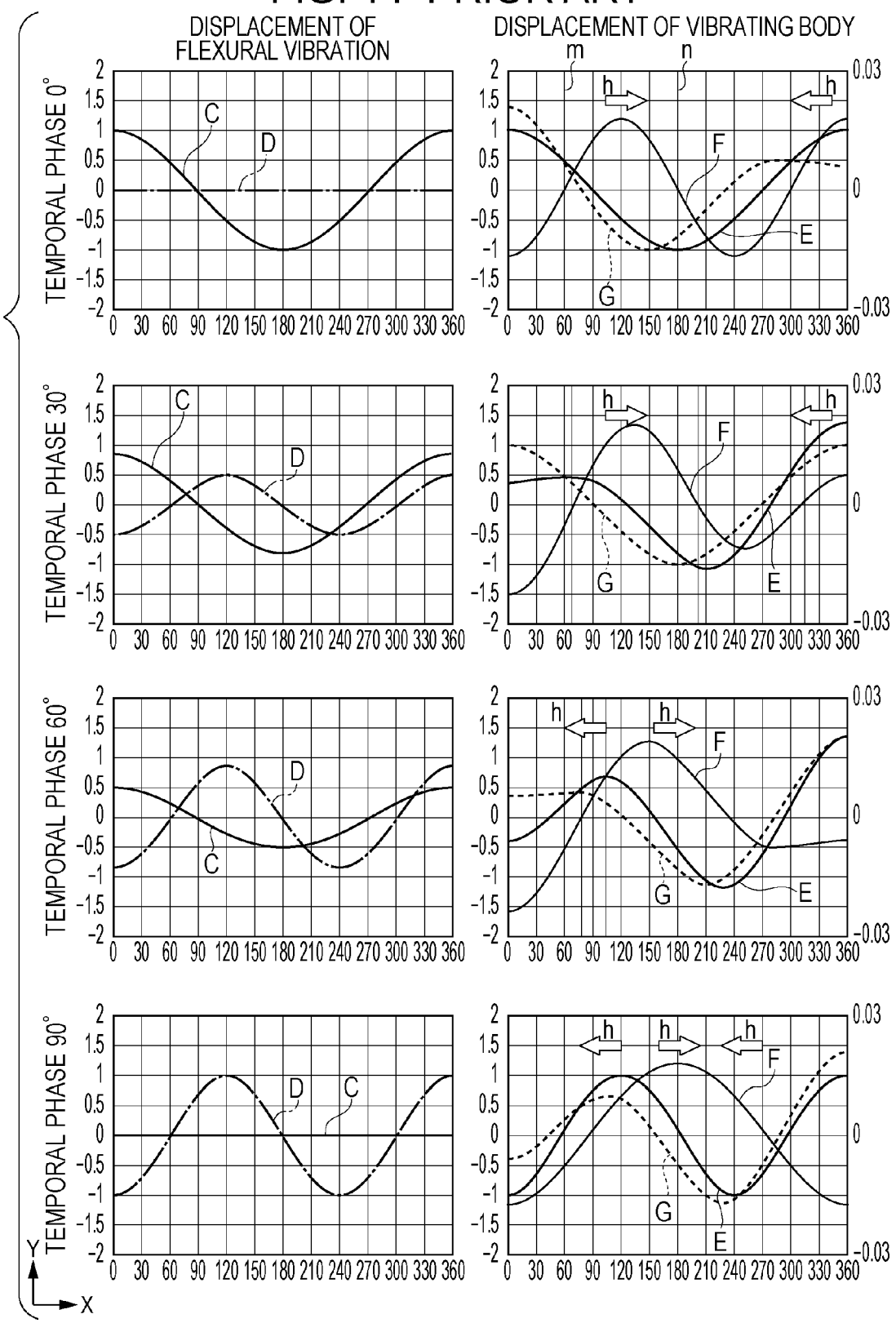
FIG. 14 is a graph illustrating, for each time phase, the out-of-plane primary bending vibration and out-of-plane secondary bending vibration in the case that the temporal phase difference of the two vibrations is 90°, and the displacement of the vibrating bodies where these vibrations overlap with each other.
Figure 15:
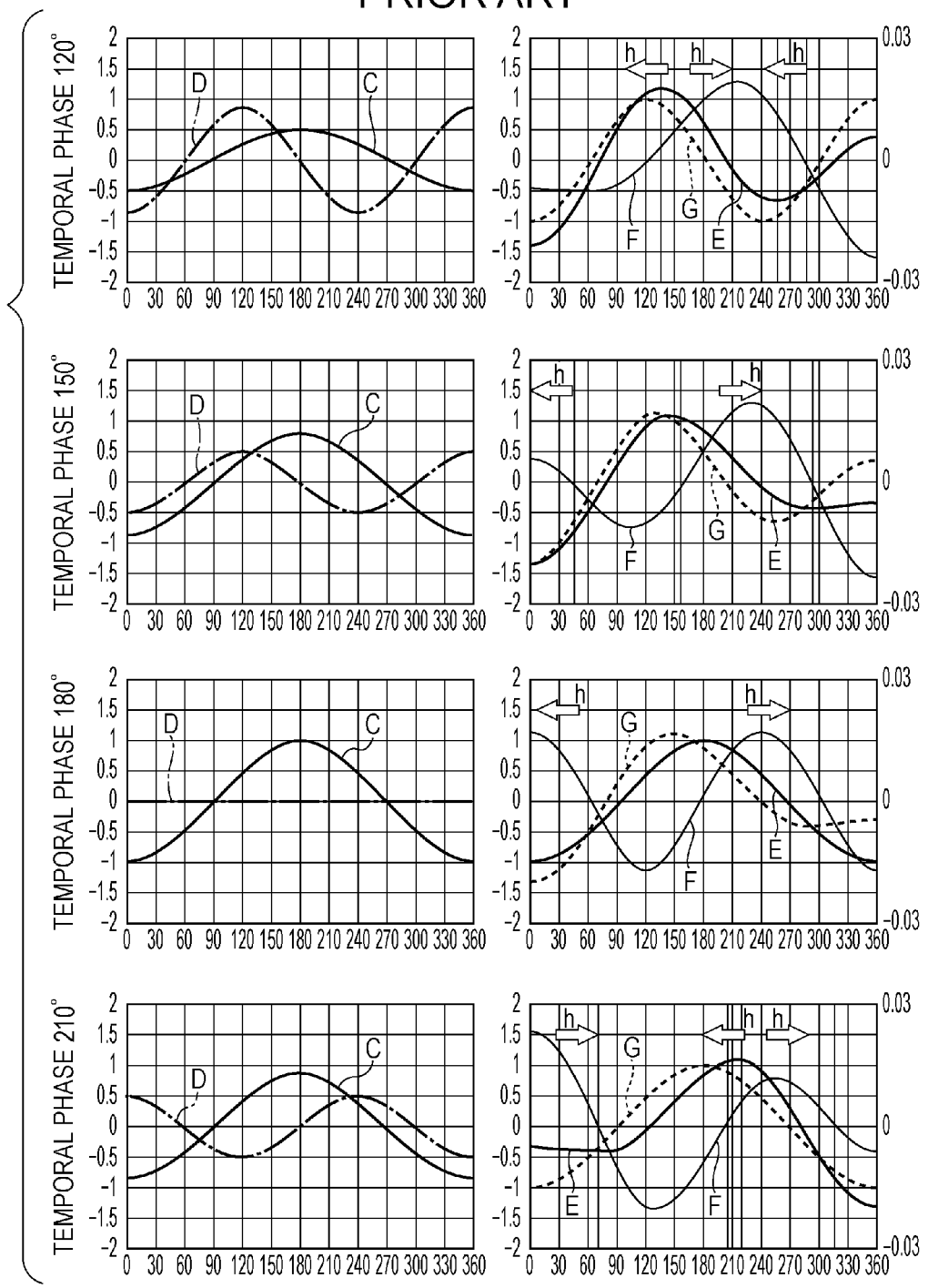
FIG. 15 is a graph illustrating, for each time phase, the out-of-plane primary bending vibration and out-of-plane secondary bending vibration in the case that the temporal phase difference of the two vibrations is 90°, and the displacement of the vibrating bodies where these vibrations overlap with each other.
Figure 16:
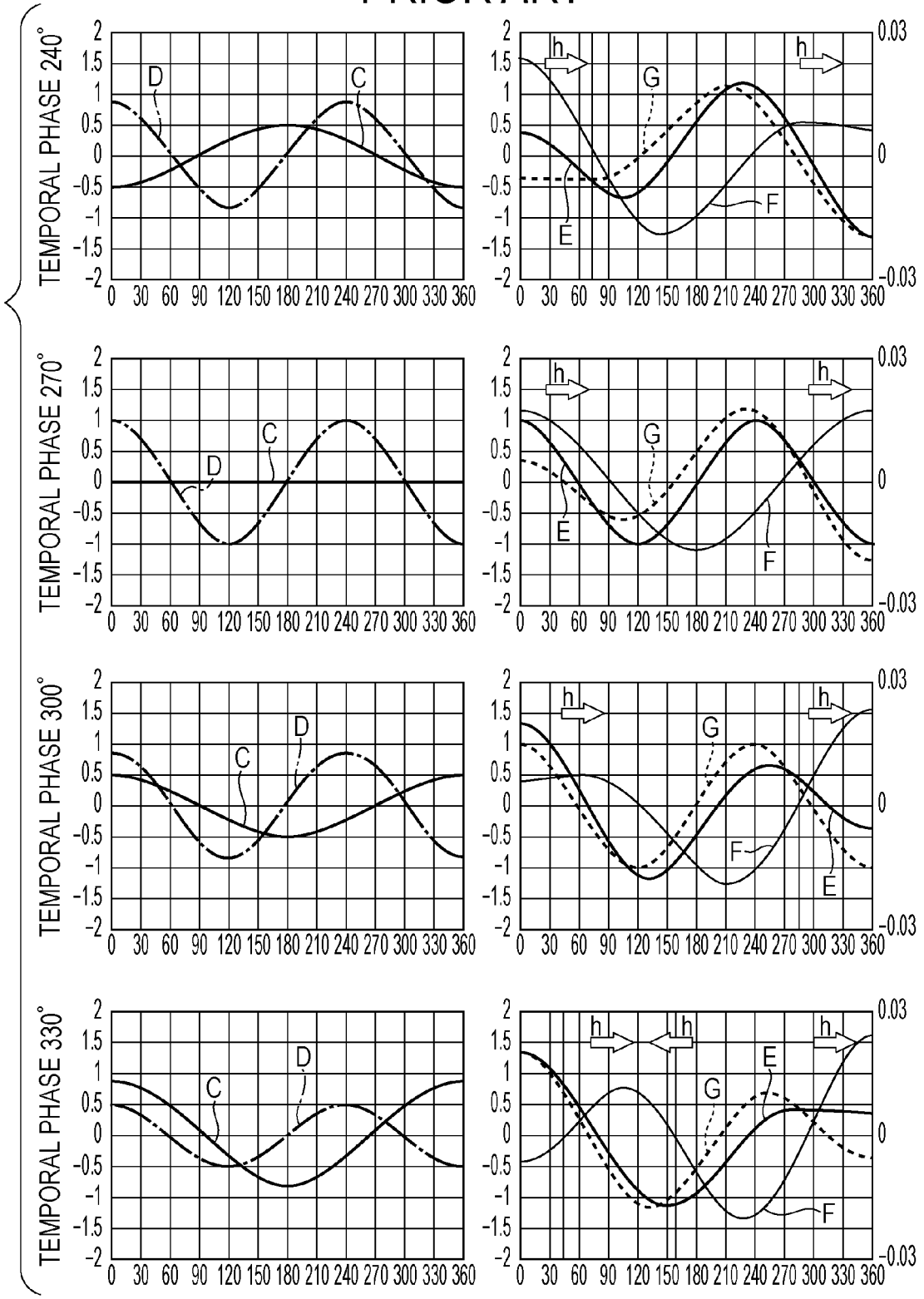
FIG. 16 is a graph illustrating, for each time phase, the out-of-plane primary bending vibration and out-of-plane secondary bending vibration in the case that the temporal phase difference of the two vibrations is 90°, and the displacement of the vibrating bodies where these vibrations overlap with each other.
Figure 17:
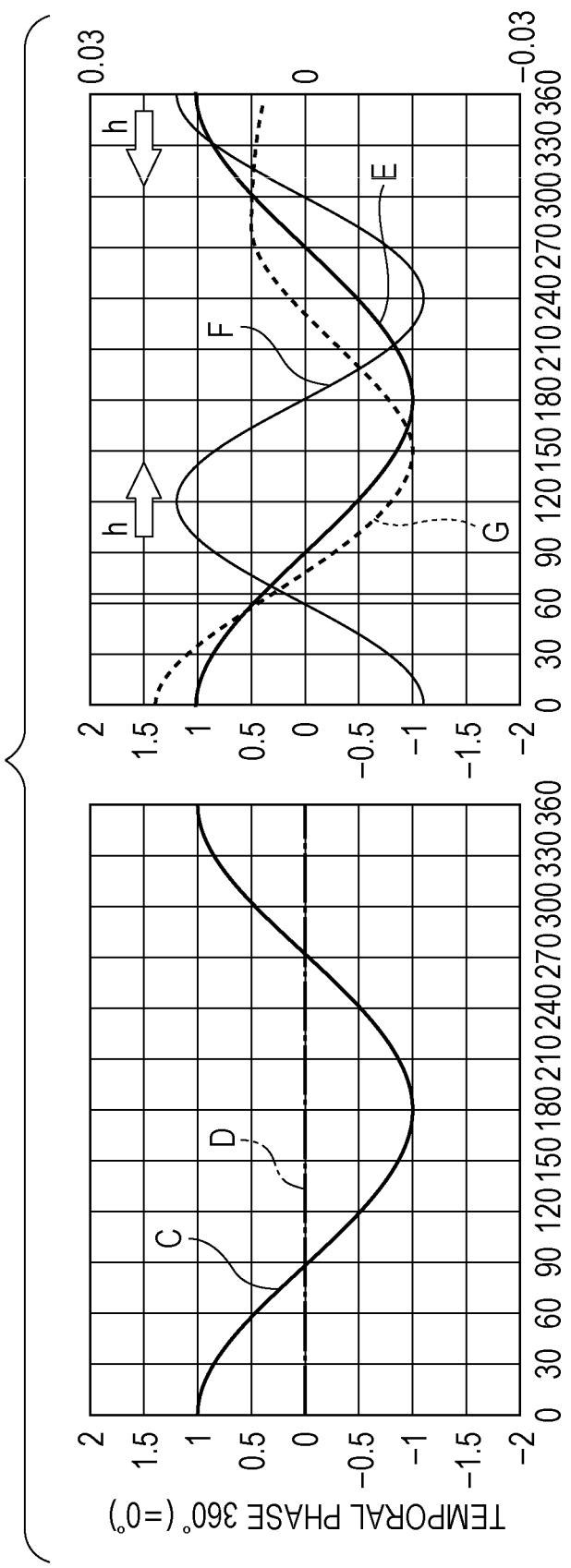
FIG. 17 is a graph illustrating, for each time phase, the out-of-plane primary bending vibration and out-of-plane secondary bending vibration in the case that the temporal phase difference of the two vibrations is 90°, and the displacement of the vibrating bodies where these vibrations overlap with each other.

Now, in order to heighten understanding of the present embodiment, details of the problems in the above-described technology (Japanese Patent Laid-Open No. 2008-207170) will be described further. FIG. 5A is a graph expressing the vibration exciting voltage frequency and the response gain of vibrations in each vibration mode for each unit of voltage (1 V). FIG. 5B is a graph expressing the vibration exciting voltage frequency and the response phase of vibrations in each vibration mode.

In FIG. 5A, plot D indicates the response gain $\alpha(1)$ of the vibrations in the first vibration mode in the case that the vibration exciting voltage E(difference), which is the alternating voltage described above, is a unit voltage (1 V). Also, plot E indicates the response gain $\alpha(2)$ of the vibrations in the second vibration mode in the case that the vibration exciting voltage E(sum), which is the alternating voltage, is a unit voltage (1 V). In FIG. 5B, plot D indicates the response phase β(1) of the vibrations in the first vibration mode as to E(difference), and plot E indicates the response phase β(2) of the vibrations in the second vibration mode as to E(sum).

Many other vibration modes also exist in the vibrating body 3, near the unique vibration numbers of the vibration modes (plots F, G, and H in FIG. 5A).

The vibration modes herein have difference displacement distributions from the first vibration mode D and second vibration mode E, and are vibration modes that change the amplitude distribution and phase distribution of the generated vibrations.

The vibration mode of plot F in FIG. 5A has a bending order in the left/right direction (first direction A) that is an out-of-plane tenth order bending deformation, similar to the first vibration mode D, and is a vibration mode (third vibration mode) that becomes an out-of-plane primary deformation in the up/down direction (second direction B). The third vibration mode has a maximum value of the response gain in the center portion in the up/down direction (second direction B) and the upper/lower end portions, and F indicates the size of response gain in the case that the maximum value E(difference) is a unit voltage (1 V). The plot F in FIG. 5B indicates a response phase of the vibrations in the third vibration mode as to the E(difference).

FIG. 6A-1 is a perspective diagram of a distorted shape of an optical device 1 in the third vibration mode F, and FIG. 6A-2 is a diagram seen from the first direction A.

The distorted shape in the third vibration mode F is distorted in the up/down direction (second direction B) in addition to the distorted shape in the first vibration mode D. Therefore, the third vibration mode has a somewhat higher number of unique vibrations than does the first vibration mode D.

Even among unnecessary vibration modes, the vibrations in the third vibration mode F are particularly large. The reason that the vibrations in the third vibration mode F are particularly large will be described now.

In order to generate vibrations in the first vibration mode D and vibrations in the second vibration mode E, a driving voltage is applied to the piezoelectric elements 2a and 2b, stretching force in the left/right direction (first direction A) is generated, and bending deformation force in the direction of the vibrating body 3 is generated. As described above, the dividing positions of the dividing electrode 9 are approaching the positions of nodal lines in the first vibration mode D and second vibration mode E.

On the other hand, in the third vibration mode F also, the phase distribution of stretching deformation in the first direction A is approaching the phase distribution of the stretching force generated by the piezoelectric element 2. Therefore, vibrations in the third vibration mode F become larger. Further, in the piezoelectric element 2, the up/down direction (second direction B) is the direction that is orthogonal to the polarization direction, and stretching force is generated in this direction also, whereby bending deformation force is generated as to the vibrating body 3.

The third vibration mode F is a vibration mode having bending deformation in the up/down direction (second direction B). Thus, the vibrations in the third vibration mode F become even larger. Similarly, the bending order in the left/right direction (first direction A) indicating the size of vibrations in G in FIGS. 5A and 5B becomes the out-of-plane eleventh order bending deformation which is the same as in the second vibration mode, and the vibrations in the vibration mode that have out-of-plane primary bending deformation in the up/down direction (second direction B) (fourth vibration mode) also are particularly large. The fourth vibration mode has a maximum value of the response gain in the center portion in the up/down direction (second direction B) and the upper/lower end portions, and G indicates the size of response gain in the case that the maximum value E(sum) of this response gain is a unit voltage (1 V). The plot G in FIG. 5B indicates a response phase of the vibrations in the fourth vibration mode as to the E(sum).

FIG. 6B-1 is a perspective diagram of a distorted shape of an optical device 1 in the fourth vibration mode G, and FIG. 6B-2 is a diagram seen from the first direction A. The distorted shape in the fourth vibration mode G is distorted in the up/down direction (second direction B) in addition to the distorted shape in the second vibration mode E. Therefore, the fourth vibration mode G has a somewhat higher number of unique vibrations than does the second vibration mode E.

The third vibration mode F and fourth vibration mode G have different displacement distributions in the up/down direction (second direction B) from the first vibration mode D and second vibration mode E, which are excited in order to move dust. Therefore, when the vibrations of the third vibration mode F and fourth vibration mode G are large, the amplitude distribution and phase distributions of the vibrations in order to move dust or the like may change. Also, locations where the dust does not move and locations having a small amount of movement may arise, whereby the effectiveness of moving dust is decreased.

Now, adding the responses of the vibrations of the third vibration mode and vibrations of the fourth vibration mode which become particularly large, the responses of the amplitude distribution and phase distribution will be described. The location of nodal line C in FIGS. 6A-1 and 6B-1 is a location where the amplitudes of the third and fourth vibration modes are zero, and therefore does not receive any influence from the vibrations of the third vibration mode and vibrations of the fourth vibration mode. However, other locations have amplitudes, the influence of which is received.

The displacement distribution in the left/right direction (first direction A) of the first vibration mode and third vibration mode both have out-of-plane tenth order bending. The vibrations combined by the vibrations in these vibration modes are called tenth order vibrations. Let us say that the size thereof is X(10, b) and the time phase is φ(10, b). Further, for the third vibration mode, let us say that the response amplitude gain is α(3, b) and the response phase is β(3, b). The third vibration mode has distributions of response amplitude and response phase, in the second direction B. The b within the parentheses is at a position in the second direction, where α(3, b) and β(3, b) are functions of the position b. Accordingly, since the tenth order vibrations also have distributions of response amplitude and response phase, in the second direction B, X(10, b) and φ(10, b) similarly are functions of the position of the b within parentheses in the second direction.

The response amplitude gain α(3, b) is a value computed from the maximum displacement location within the displacement distribution of the position b in the third vibration mode. The maximum displacement location herein is one location for each wavelength in the first direction A, and at these positions have the same amplitude value. The distribution of response phases in the third vibration mode a fixed valued at the locations where the displacement within the same position b is a positive location. Also, at a location where the displacement is negative, the fixed value is of an inverse phase different by 180° as to the response phase at a positive location. The response phase β(3, b) is a value of which the response phase is computed, where the displacement is at a positive location at position b. Also, the vibrations of the first vibration mode and the vibrations of the third vibration mode have a response amplitude gain as to the E(difference) of α(10, b) and the response phase of β(10, b), of the combined vibration. These become functions of the position b in the second direction.

α(10, b) and β(10, b) are measured using a laser Doppler vibration gauge or the like in the state of applying just the E(difference), and become known numbers. Also, by performing mode analysis in numerical analysis using a finite element method, a joint position may be identified having a response gain of zero in the third vibration mode. At this joint position, there is no influence from the third vibration mode, whereby according to the above-described measurement, the response amplitude gain α(1) and response phase β(1) of the vibrations in the first vibration mode may be measured with the above-described measurement. The first vibration mode has the same response to the second direction B. α(1) and β(1) may be subjected to mathematical vector analysis from the measured α(10, b) and β(10, b), whereby α(3, b) and β(3, b) may become known values.

The size X(10, b) and the time phase φ(10, b) of the tenth order vibrations are expressed in the Expressions (11) through (14) below.

$$X(10,b)=\alpha(10,b) \times V(\text{difference}) \quad \text{Expression (11)}$$

$$\alpha(10,b)=[\{\alpha(1)\times\sin\theta(1)+\alpha(3,b)\times\sin\theta(3,b)\}^2+\{\alpha(1)\times\cos\theta(1)+\alpha(3,b)\times\cos\theta(3,b)\}^2]^{0.5} \quad \text{Expression (12)}$$

$$\phi(10,b)=\beta(10,b)+\theta(\text{difference}) \quad \text{Expression (13)}$$

$$\beta(10,b)=\tan^{-1}[\{\alpha(1)\times\sin\theta(1)+\alpha(3,b)\times\sin\theta(3,b)\}/\{\alpha(1)\times\cos\theta(1)+\alpha(3,b)\times\cos\theta(3,b)\}] \quad \text{Expression (14)}$$

Similarly, the displacement distribution in the left/right direction (first direction A) of the second vibration mode and fourth vibration mode both have out-of-plane eleventh order bending. The vibrations combined by the vibrations in these vibration modes are called eleventh order vibrations. Let us say that the size thereof is X(11, b) and the time phase is φ(11, b). Further, for the fourth vibration mode, let us say that the response amplitude gain is α(4, b) and the response phase is β(4, b). The fourth vibration mode and eleventh order vibrations also have distributions of response amplitude and response phase, in the second direction B. The b within the parentheses is at a position in the second direction, where α(4, b) and β(4, b), and X(11, b) and φ(11, b) are functions of the position b. The definitions of α(4, b) and β(4, b), and α(11, b) and β(11, b) are similar to the α(3, b) and β(3, b), and α(10, b) and β(10, b) described above. α(2), β(2), α(4, b), β(4, b), α(11, b), and β(11, b) may become known values by using measurements by a laser Doppler vibration gauge while in the state of applying just E(sum), mode analysis results and vector analysis or the like.

The size X(11, b) and the time phase φ(11, b) of the eleventh order vibrations are expressed in the Expressions (15) through (18) below.

$$X(11,b)=\alpha(11,b) \times V(\text{sum}) \quad \text{Expression (15)}$$

$$\alpha(11,b)=[\{\alpha(2)\times\sin\theta(2)+\alpha(4,b)\times\sin\theta(4,b)\}^2+\{\alpha(2)\times\cos\theta(2)+\alpha(4,b)\times\cos\theta(4,b)\}^2]^{0.5} \quad \text{Expression (16)}$$

$$\phi(11,b)=\beta(11,b)+\theta(\text{sum}) \quad \text{Expression (17)}$$

$$\beta(11,b)=\tan^{-1}[\{\alpha(2)\times\sin\theta(2)+\alpha(4,b)\times\sin\theta(4,b)\}/\{\alpha(2)\times\cos\theta(2)+\alpha(4,b)\times\cos\theta(4,b)\}] \quad \text{Expression (18)}$$

Similar to the case of considering just the first and second vibration modes as described above, in order to more effectively move dust or the like, the voltage amplitude ratio ∈ and time phase difference δ of E(1) and E(2) may be computed and set from the Expressions (11) through (18), Expressions (5) through (8), Expression (19) of X(0)=X(10, b)=X(11, b), and Expression (20) of φ(10, b)−φ(11, b)=90°. X(0) is the size of amplitude to be set beforehand, considering the moving state of the object to be moved.

According to the related art (Japanese Patent Laid-Open No. 2008-207170), driving voltage to be applied is set, considering just the vibrations of the two vibration modes that primarily are excited (similar to the first and second vibration modes according to the present embodiment). However, while responses occur in other vibration modes, these have not been considered. Modifying the voltage settings in order to switch the direction of movement is described, but if the movement direction is the same, the combination of two driving voltages becomes one setting. That is to say, if the movement direction is the same, the time phase difference of the two driving voltages will have an identified combination. It goes without saying that the voltage amplifying ratio of the two driving voltages will also have an identified combination. Therefore, the proximity of locations where the amplitudes are nodal lines of zero for both the third and fourth vibration modes become the optimal vibration state, and other locations may lose capability to move dust. That is to say, the amplitude distribution of the combined vibration occurring in the vibration body does not change and becomes constant.

The present embodiment takes into consideration responses of vibrations in unnecessary vibration modes such as the third and fourth vibration modes, and enables moving dust or the like in a wider range and with greater efficiency.

Now, the vibration response, driving method, and the advantage thereof according to the present embodiment will be described. In the case that E(difference) and E(sum) are the same size in the frequencies of the driving voltages E(1) and E(2), the frequency is such that the size of vibrations in the first and second vibration modes is the same, and is denoted by f in FIG. 5A. When the frequency of E(1) and E(2) is f, the frequency of E(difference) and E(sum) is also f.

In the frequency f, the maximum value F of the size of vibrations in the third vibration mode is half the size of vibrations in the first and second vibration modes. Also, the maximum value G of the size of vibrations in the fourth vibration mode is one-fourth the size of vibrations in the first and second vibration modes.

If the size of these vibrations are normalized by the size of vibrations of the first vibration mode, the maximum value of α(1)=1, α(2)=1, α(3, b) is 0.5, and the maximum value of α(4, b) is 0.25.

Also, the response phase β(1) in the first vibration mode D as to the E(difference) is −165°, and the response phase β(2) in the second vibration mode E as to the E(sum) is −15°. The response phase β(3, b) in the third vibration mode F as to the E(difference) is −157° in a region sandwiched between two nodal lines C that are parallel to the first direction A in FIG. 6A-1, and is an inverted 23° on the outer side thereof.

The response phase β(4, b) in the fourth vibration mode G as to the E(sum) is −12° in a region sandwiched between two nodal lines C that are parallel to the first direction A in FIG. 6B-1, and is an inverted 168° on the outer side thereof.

Now, specific voltage settings and vibration state based on the related art will be described. The Expressions (1) through (10), the values α(1) and α(2), and the values β(1) and β(2) are used to compute the voltage amplitude ratio ∈ and the time phase difference δ of the voltage settings.

If α(1)=1 is substituted into Expression (1), V(difference)=X(1) holds. If α(2)=1 is substituted into Expression (3), V(sum)=X(2) holds. From these and from Expression (9), V(difference)=V(sum) holds.

If β(1)=−165° is substituted into Expression (2), θ(difference)=φ(1)+165° holds. If β(2)=−15° is substituted into Expression (4), θ(sum)=φ(2)+15° holds. From these and from Expression (10), θ(difference)−θ(sum)=240° holds. Now, if θ(difference)=0° with θ(difference) as the time phase reference, θ(sum)=−240° holds.

If V(difference)=V(sum) and θ(difference)=0° and θ(sum)=−240° are substituted into Expressions (5) through (8) and calculated, then V(1)=V(difference), V(2)=1.732×V(difference), θ(1)=60°, and θ(2)=150° hold. Thus, the voltage amplitude ratio ∈=V(2)/V(1)=1.732 and time phase difference δ=90° are set. From the voltage amplitude ratio ∈ and time phase difference δ, the vibrations of the first vibration mode and the vibrations of the second vibration mode will be the same size, and will be in a vibration state of a 90° time phase difference. For example, if the amplitude X(0) to be set is 100, then the voltage setting is V(1)=100, V(2)=173.2, and the time phase difference δ of E(2) as to E(1) is 90°, and the vibration state becomes X(0)=X(1)=X(2)=100, φ(1)−φ(2)=90°.

However, as described above, since there are influences from the vibrations in the third and fourth vibration modes, other than at positions of the nodal lines of the vibrations in the third and fourth vibration modes, the tenth order vibrations and eleventh order vibrations are the same size, and disappear in the state of a 90° time phase difference.

Now, as an example, the responses of the tenth order vibrations and eleventh order vibrations at the central portion in the up/down direction (second direction B) and the upper and lower ends, at the same voltage settings, will be described.

The responses of the tenth order vibrations and eleventh order vibrations at the central portion in the up/down direction (second direction B) are obtained from the Expressions (11) through (14), from the above-described V(difference)=V(sum) and θ(difference)=0° and θ(sum)=−240°, and from α(3, b)=0.5 and β(3, b)=−165° and α(4, b)=0.25 and β(4, b)=−12°. Thus, X(10, b)=150, φ(10, b)=−162°, X(11, b)=125, and φ(11, b)=−254° hold. Thus, X(10, b) and X(11, b) are not the same size, and φ(10, b) and φ(11, b) are not in the same 90° time phase difference, and the capability to move dust is decreased. Also, X(10, b) and X(11, b) greatly differ from the size X(0)=100 which is the amplitude to be set.

Similarly, the responses at the upper and lower ends in the up/down direction (second direction B) are obtained from the Expressions (11) through (14), from the above-described V(difference)=V(sum) and θ(difference)=0° and θ(sum)=−240°, and from α(3, b)=0.5 and β(3, b)=−165° and α(4, b)=0.25 and β(4, b)=−12°. Thus, X(10, b)=51, φ(10, b)=−173°, X(11, b)=75, and φ(11, b)=−256° hold. Thus, X(10, b) and X(11, b) are not the same size, and φ(10, b) and φ(11, b) are not in the same 90° time phase difference, and the capability to move dust is decreased. Also, X(10, b) and X(11, b) greatly differ from the size X(0)=100 which is the amplitude to be set.

According to the present embodiment, the responses (excitations/vibrations) that are particularly large in the third and fourth vibration modes are taken into account, and the control unit changes the voltage amplitude ratio ∈ and the time phase difference δ of the driving voltages E(1) and E(2). That is to say, the voltage amplitude ratio e and the time phase difference δ of the driving voltages E(1) and E(2) are changed in a time-series manner at predetermined time units. The responses of the vibrations in the third and fourth vibration modes have a distribution in the second direction B, as described above. Taking this into consideration, using the response amplitude gain α(3, b) and response phase β(3, b) of the vibrations in the third vibration mode as a threshold, the optical device 1 if virtually dividing into ten region (regions 1 through 10) in the up/down direction (second direction B), as illustrated in FIG. 7A. FIG. 7B is a perspective diagram of a distorted shape of an optical device 1 in the third vibration mode. FIG. 7C is a diagram seen from the first direction A and illustrates the disposal of regions 1 through 10.

The present embodiment is focused on having an optimal alternating voltage setting for each of the regions herein, and so as to change the amplitude distribution of the combined vibrations, at least one of the voltage amplitude ratio and time phase difference of the driving voltages is changed. With such a driving voltage, ideally, the region having the optimal vibration state is switched sequentially in a time-series manner, and having all of the regions to experience an optimal vibration state during one control period may be realized.

The response amplitude gain and response phase distribution in the first through fourth vibration modes each are in a vertically symmetrical relation. Accordingly, as illustrated in FIG. 7A, the combination of regions 1 through 10 and the settings of the alternating voltage becomes one pair of regions where the vertically symmetrical regions from regions 1 through 10 set (apply) the same alternating voltage. Also, the first through fifth alternating voltages are set as to the pair of regions that sets the same alternating voltage. That is to say, "a region regarding which is set the same alternating voltage" references not necessarily just one physically continuous region, but even if in a physically separate location, as long as the region sets the same alternating voltage, this may be "a region regarding which is set the same alternating voltage". Accordingly, in the case of distinguishing "a first region to set the same alternating voltage" and "a second region to set the same alternating voltage", there may be cases where each region is one physically continuous region and there may be cases where at least one region is a group of physically separated regions. The regions included in the first region and second region each set the same alternating voltage, and the first region alternating voltage and the second region alternating voltage are set with mutually different alternating voltages.

Also, according to the present embodiment, if at least two regions to be set (virtually divided) exist, the advantages of the present embodiment may be obtained, but the number of regions to be set (virtually divided) is not limited to two, and depending on the state of the vibrations to bet set, setting (division) may be made into two or more regions. That is to say, virtually dividing into a first through n'th region (n is an integer that is 2 or greater), and computing an optimal alternating voltage setting for each region may be performed.

Also, the method of setting (dividing) each region is determined appropriately based on the state of the vibrations to be set and the shape of the vibration target. For example, if the vibration target is rectangular, the regions may be set (divided) in multiple lines in the direction orthogonal to the lengthwise direction of the vibration target. Similarly, the regions may be set (divided) in multiple lines in the direction parallel to the lengthwise direction of the vibration target. Also, the regions may be set (divided) in multiple lines in a grid form, in the direction orthogonal to the lengthwise direction and in the direction parallel to the lengthwise direction of the vibration target. If the vibration target is round-shaped, multiple regions may be set in lines, similar to the rectangular vibration target, but multiple regions may also be set in concentric circles.

According to the present embodiment, the regions 5 and 6 together serve as a first region regarding which is set a first alternating voltage which is the same alternating voltage. Similarly, the regions 4 and 7 together serve as a second region regarding which is set a second alternating voltage which is the same alternating voltage. Similarly, the regions 3 and 8 together serve as a third region regarding which is set a third alternating voltage which is the same alternating voltage. Similarly, the regions 2 and 9 together serve as a fourth region regarding which is set a fourth alternating voltage which is the same alternating voltage. Similarly, the regions 1 and 10 together serve as a fifth region regarding which is set a fifth alternating voltage which is the same alternating voltage. The first through fifth alternating voltages mutually differ in at least one value of the voltage amplitude ratio and time phase difference.

The control device according to the present embodiment has an optimal alternating voltage set for each of the first through fifth regions, and an optimal vibrating state is sequentially realized for the first through the fifth region. The regions and the alternating voltage settings correspond as illustrated in FIG. 7A. The first alternating voltage has settings as described above in order for the first region to be in an optimal vibrating state. The second alternating voltage has settings in order for the second region to be in an optimal vibrating state. The third alternating voltage has settings in order for the third region to be in an optimal vibrating state. The fourth alternating voltage has settings in order for the fourth region to be in an optimal vibrating state. The fifth alternating voltage has settings in order for the fifth region to be in an optimal vibrating state. Now, the expression above of "the first alternating voltage has settings" refers to an alternating voltage "combination" which is applied, in the case there are two piezoelectric elements, to each of the first and second piezoelectric elements in order to have "the first region" in an optimal vibrating state. That is to say, the settings of the first alternating voltage has an amplitude ratio (first amplitude ratio) and time phase difference (first time phase difference) for the alternating voltages to be applied to each of the first and second piezoelectric elements. Similarly, the settings of the second alternating voltage have a second amplitude ratio and second time phase difference. Similarly, the settings of the third through fifth alternating voltages have a third through fifth voltage amplitudes and third through fifth time phase difference. That is to say, the settings of the n'th alternating voltage corresponding to the n'th region are expressed by the amplitude ratio (n'th amplitude ratio) and time phase difference (n'th time phase difference) of the alternating voltages.

The computations of the alternating voltage settings are performed using the values expressed in FIG. 8. The computations of each of the alternating voltage settings are performed using the intermediate value of $\alpha(3, b)$ in each corresponding region. The responses of the vibrations in the first and second vibration modes have uniform responses in the up/down direction (second direction B). In all of the regions, $\alpha(1)=1$, $\alpha(2)=1$, $\beta(1)=-165°$, and $\beta(2)=15°$ hold. In regions 5 and 6, which are the first region where the first alternating voltage is set, $\alpha(3, b)$ is 0.3 to 0.5, and the intermediate value thereof of 0.4 is used. In the settings for other alternating voltages also, similarly the intermediate value in the $\alpha(3, b)$ range is used. In a region sandwiched by two nodal lines C that are parallel to the first direction A in FIG. 7B, $\beta(3, b)$ is −157°, and outside thereof is 23°. Corresponding thereto, the values of $\beta(3, b)$ are those expressed in FIG. 8. The setting values of the alternating voltages in regions 3 and 8 which are the third region in which the third alternating voltage is set are described as −157° or 23°, but the response amplitude gain $\alpha(3, b)$ used here is zero, so the values do not have actual meaning.

The displacement distribution in the up/down direction (second direction B) in the fourth vibration mode is the same as the third vibration mode, whereby $\alpha(4, b) \propto \alpha(3, b)$ holds. $\alpha(3, b)$ and $\alpha(4, b)$ also have maximum values in the center portion in the up/down direction (second direction B) and at the upper and lower ends, where the former is 0.5 and the latter is 0.25. Thus, we see that $\alpha(4, b)=0.5 \times \alpha(3, b)$. In a region sandwiched by two nodal lines C that are parallel to the first direction A in FIG. 7B, $\beta(4, b)$ is −12°, and outside thereof is 168°. Corresponding thereto, the values of $\beta(4, b)$ are those expressed in FIG. 8. The setting values of the alternating voltage in regions 3 and 8 which are the third region in which the third alternating voltage is set are described as −12° or 168°, but the response amplitude gain $\alpha(4, b)$ used here is zero, whereby the values do not have actual meaning.

Using the values expressed in FIG. 8, the Expressions (5) through (8), and the Expressions (11) through (20), the settings of each alternating voltage are computed, where $X(0)=100$ which is the same as the specific voltage settings based on the above-described related art.

From the values expressed in FIG. 8 and the Expressions (12), (14), (16), and (18), the values of $\alpha(10, b)$, $\beta(10, b)$, $\alpha(11, b)$, and $\beta(11, b)$ which are used to set the alternating voltages are as expressed in FIG. 9A. From the values expressed in FIG. 9A and from the Expressions (11), (13), (15), (17), (19), and (20), the V(difference), θ(difference), V(sum), and θ(sum) are as noted in FIG. 9B. From the values expressed in FIG. 9B and from the Expressions (5) through (8), V(1), θ(1), V(2), and θ(2) are as noted in FIG. 9C. Also, the values of the voltage amplitude ratio ∈ and the time phase difference δ are expressed in FIG. 9C. The first through fifth voltage amplitude ratios ∈ have mutually different values. The first through fifth time phase differences δ also have mutually different values.

Now, regarding the settings of the alternating voltages, the vibration state within a corresponding region will be described. In each region, the locations used to compute the corresponding alternating voltage settings are $X(10)=X(11)=X(0)=100$, and $\phi(1)-\phi(2)=90°$, and are in an optical vibration state. The vibration state worsens as the location moves farther away, and within a region, the border of the region (hereinafter region border) has the lesser vibration state.

The vibration state in the region border herein will be computed. FIG. 10 expresses the values of $\alpha(1)$, $\beta(1)$, $\alpha(2)$, $\beta(2)$, $\alpha(3, b)$, $\beta(3, b)$, $\alpha(4, b)$, and $\beta(4, b)$, at the region border. From the values expressed in FIG. 10 and the Expressions (12), (14), (16), and (18), the values of $\alpha(10, b)$, $\beta(10, b)$, $\alpha(11, b)$, and $\beta(11, b)$ will be as those expressed in FIG. 11. From the values in FIG. 11, from the values of the alternating voltage settings in FIG. 9B, and from the Expressions (11), (13), (15), and (17), the vibrating state at the region border in each of the alternating voltage settings will be as those expressed in FIG. 12A.

Now, advantages of the present embodiment as to the related art will be described. As described up to this point, the optimal vibration state to efficiently move dust or the like is a state where the tenth order vibrations and eleventh order vibrations are the same size and have a 90° time phase difference. As an index thereof, the value of $X(10, b)/X(11, b)$ and the value of $\phi(10, b)-\phi(11, b)$ may be used. The closer $X(10, b)/X(11, b)$ is to 1, the more favorable the value is, and also the closer $\phi(10, b)-\phi(11, b)$ is to 90°, the more favorable the value is.

The settings of the driving voltage by the related art as described above uses a pair of alternating voltage settings as to the entire optical device 1. That is to say, the voltage amplitude ratio and time phase difference of the two driving voltages are fixed. At a position of nodal lines that are parallel to the first direction A in the third and fourth vibration modes, $X(1)=X(2)=X(10, b)=X(11, b)$ holds, and $X(10, b)/X(11, b)$ becomes 1. Also, $\phi(1)-\phi(2)=90°$ where $\phi(1)=\phi(10, b)$ and $\phi(2)=\phi(11, b)$, whereby $\phi(10, b)-\phi(11, b)=90°$. However, for example, the center portion in the up/down direction (second direction B) or upper and lower end portions where $\alpha(3, b)$ and $\alpha(4, b)$ are the maximum values has the vibration state different from the vibration state at the position of nodal lines. As described above, at the center portion here, $X(10, b)=150$, $\phi(10, b)=-162°$, $X(11, b)=125$, and $\phi(11, b)=-254°$ holds. Thus, $\phi(10, b)-\phi(11, b)=-162°-(-254°)=92°$, where $X(10, b)/X(11, b)=150/125=1.2$. At the upper and lower end portions, $X(10, b)=51$, $\phi(10, b)=-173°$, $X(11, b)=75$, and $\phi(11, b)=-256°$. Thus, $\phi(10, b)-\phi(11, b)=-173°-(-256°)=83°$, where $X(10, b)/X(11, b)=51/75=0.68$. In a worse vibrating state, $\phi(10, b)-\phi(11, b)=83°$, where $X(10, b)/X(11, b)=0.68$ at the upper and lower end portions. Now, there is a 32% difference in $X(10, b)/X(11, b)$ as to the optimal state, and there is a 7° difference in $\phi(10, b)-\phi(11, b)$.

On the other hand, in the driving voltage settings according to the present embodiment, upon calculating $X(10, b)/X(11, b)$ and $\phi(10, b)-\phi(11, b)$ at the region borders making up a region where the same alternating voltage is set, that expressed in FIG. 12B is the result. Computations use the $X(10, b)$, $X(11, b)$, $\phi(10, b)$, and $\phi(11, b)$ in FIG. 12A described above.

The driving procedures according to the present embodiment switches the driving voltage settings from the first to the fifth alternating voltages, sequentially in a time-series manner, in units of a predetermined amount of time, and switches the amplitude distribution and phase distribution of the combined vibrations generated in the vibrating body, in a time-series manner. That is to say, according to the present embodiment, the voltage amplitude ratio of the driving voltages is changed in a time-series manner from the voltage amplitude ratio of the first alternating voltages to the voltage amplitude ratio of the n'th alternating voltages, and the phase difference of the driving voltages is changed in a time-series manner from the phase difference of the first alternating voltages to the n'th alternating voltages. Thus, the region corresponding to each of the alternating voltage settings are caused to be in a favorable vibration state. The locations in the worse vibration regions in each corresponding region are the positions at the region borders, and are as expressed in FIG. 12B. As in FIG. 12B, the vibration state that is worst is the upper and lower end portions of the regions 1 through 10 in the settings of the fifth alternating voltage, and are $\phi(10, b)-\phi(11, b)=87.6°$ where $X(10, b)/X(11, b)=0.90$. $X(10, b)/X(11, b)$ is a difference of 10% as to the optimal state of $X(10, b)/X(11, b)=1$ and $\phi(10, b)-\phi(11, b)=90°$, and $\phi(10, b)-\phi(11, b)$ has a difference of 2.4°.

In the event that the driving procedures are completed, all of the locations of the optical device 1 experience a more favorable vibration state. According to the related art, $X(10, b)/X(11, b)$ is a difference of 32% as to the optimal state of $X(10, b)/X(11, b)=1$ and $\phi(10, b)-\phi(11, b)=90°$, and $\phi(10, b)-\phi(11, b)$ has a difference of 7°, whereby $X(10, b)/X(11, b)$ of the present embodiment is more favorable, and also $\phi(10, b)-\phi(11, b)$ is more favorable, whereby at all of the locations of the optical device 1, dust or the like may be more efficiently moved. Also, in the region borders, $X(10, b)$ and $X(11, b)$ is made up of a value nearer the target value $X(0)=100$ as compared to the related art.

Now, according to the present embodiment, so as to change the amplitude distribution of the combined vibrations, at least one of the voltage amplitude ratio and time phase difference of the driving voltages may be changed, but as described according to the present embodiment, changing both the voltage amplitude ratio and time phase difference is favorable.

Also, according to the present embodiment, not only may the amplitude distribution of the combined vibrations be changed in a time-series manner, but also the phase distribution of the combined vibrations may be changed in a time-series manner.

Further, in the event of changing the voltage amplitude ratio and time phase difference of the driving voltages in a time-series manner, changes made be made smoothly or may be instantaneously switched.

Piezoelectric Material

The piezoelectric material used for the piezoelectric element according to the present embodiment has a lead content of less than 1000 ppm. The piezoelectric material used in dust removal apparatuses with the related art has been mostly a piezoelectric ceramic, the main component of which is zirconate titanate. Therefore, for example if the dust removal apparatus is discarded and subjected to acid precipitate, or disposed in a severe environment, the lead components in the piezoelectric material may leak into the ground and cause harm to life systems. However, if the lead content is less than 1000 ppm, even if the dust removal apparatus 470 is discarded and subjected to acid precipitate, or disposed in a severe environment, the probability that the lead components within the piezoelectric material 431 will harm the environment is small.

The lead content of the piezoelectric material may be evaluated by the lead content as to the total weight of the piezoelectric material as measured by a fluorescent X-ray analysis (XRF) or ICP emission spectrochemical analysis.

A piezoelectric ceramic, the main component of which is barium titanate, is a favorable piezoelectric material according to the present embodiment. With such a non-lead piezoelectric ceramic, at present, various types of features have not realized an excellent material that rivals a piezoelectric ceramic, the main component of which is zirconate titanate. However, in the case that the piezoelectric material is a piezoelectric ceramic, the main component of which is barium titanate, the elasticity is greater than that of zirconate titanate. The vibration apparatus according to the present embodiment generates an out-of-plane vibration in the optical element 1 which is an elastic body, by the stretching vibrations in the lengthwise direction of the piezoelectric elements 2a and 2b, but if the elasticity of the piezoelectric elements 2a and 2b is great, then even if the piezoelectric features such as piezoelectric constant or the like does not influence the zirconate titanate slightly, a similar out-of-plane vibration as that with the related art may be generated in the optical element 1. Therefore, the piezoelectric material according to the present embodiment takes into consideration environmental aspects, so having a piezoelectric ceramic, the main component of which is barium titanate, is favorable.

Note that the term ceramic as described in the present Specification has a metal oxide as the basic component thereof, and indicates a so-called poly crystal which is an aggregate of crystals (also called bulk unit) that has been baked hard by a heating process. This includes that which is processed after sintering.

The piezoelectric material according to the present embodiment is expressed by General Expression (1) below.

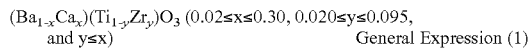
$(Ba_{1-x}Ca_x)(Ti_{1-y}Zr_y)O_3$ (0.02≤x≤0.30, 0.020≤y≤0.095, and y≤x)  General Expression (1)

A perovskite-like metal oxide expressed above is favorable as the main component.

According to an embodiment, a perovskite-like metal oxide indicates a metal oxide, ideally having perovskite configuration which is a cubic structure, as described in Iwanami Science Dictionary, Fifth Edition (Iwanami Books, issued Feb. 20, 1998). Metal oxides having a perovskite configuration are generally expressed by the chemical formula $ABO_3$. In a perovskite-like metal oxide, the elements A and B take a predetermined position in ion-form in unit grids called A-site and B-site. For example if the unit grid is of a cubic crystal, the A element is positioned at the apex of the cube, and the B element is positioned at the body center. The O element takes a face center position of the cube as a negative ion of oxygen.

The metal oxide expressed in the General Expression (1) above means that the metallic elements positioned at the A-site are Ba and Ca, and the metallic elements positioned at the B-site Ti and Zr. However, a portion of the Ba and Ca may be positioned at the B-site. Similarly, a portion of the Ti and Zr may be positioned at the A-site.

In the General Expression (1), the mol ratio of the element at the B-site and the O element is 1:3, but even in the case of the mol ratio slightly shifting (e.g., 1.00:2.94 to 1.00:3.06), if the metal oxide is primarily perovskite-like, this is included in the scope of the disclosure.

Whether the metal oxide is perovskite-like may be determined by configuration analysis by X-ray diffraction or electron diffraction.

In the General Expression (1), x indicating the mol ratio of Ca at the A-site is in the range of 0.02≤x≤0.30. If x is smaller than 0.02, then dielectric loss (tan δ) increases. If dielectric loss increases, the heat generation occurring in the event that the piezoelectric element 430 has voltage applied thereto and is driven increases, resulting in the possibility of decreased driving effectiveness. On the other hand, if x is greater than 0.30, the piezoelectric features may not be sufficient.

In the General Expression (1), y indicating the mol ratio of Zr at the B-site is in the range of 0.020≤y≤0.095. If y is smaller than 0.020, then the piezoelectric features may not be sufficient. On the other hand, if y is greater than 0.095, then Curie temperature (Tc) is lowered to less than 85° C., whereby the piezoelectric features may vanish at a high temperature.

According to the present Specification, Curie temperature refers to the temperature at which ferroelectricity vanishes. An identifying method thereof may be a method to directly measure the temperature at which ferroelectricity vanishes, while changing the measurement temperature, as well as a method to measure permittivity while changing the measurement temperature using a minute alternating electric field, and obtain the temperature from a temperature that indicates the permittivity to be extremely large.

In the General Expression (1), the Ca mol ratio x and the Zr mol ratio y is within a range of y≤x. If y>x, then dielectric loss increases, and insulation may become insufficient. Also, if the ranges of x and y described up to this point are simultaneously satisfied, a phase transition temperature T may be moved from nearly room temperature to lower than the operating temperature, and the piezoelectric element 430 may be driven over a wide temperature range and with stability.

Also, in the General Expression (1), it is favorable for A/B, which indicates the ratio of the mol amount of Ba and Ca at the A-site and the mol amount of Ti and Zr at the B-site, to be within a range of 1.00≤A/B≤1.01. If A/B is smaller than 1.00, then abnormal grain growth may occur readily, and mechanical strength of the piezoelectric material may decrease. On the other hand, if A/B is greater than 1.01, then the temperature needed for grain growth is increased too high, and with a general kiln the density may not be sufficiently large, or the piezoelectric material may have multiple pores and defects.

It is preferable for the piezoelectric material according to the present embodiment to have a main component of perovskite-like metal oxide which is expressed by the General Expression (1) above, to have an Mn content in the metal oxide, and for the Mn content 0.02 parts by weight or greater and 0.40 parts by weight or less by metallic conversion as to the as to 100 parts by weight of a metal oxide.

When Mn is contained within this range, insulation properties and a mechanical quality coefficient Qm increases. The increase in insulation properties and mechanical quality coefficient Qm may originate from a defect dipole being introduced by Mn which has different valences from Ti and Zr, and an internal electric field being generated. If an internal electric field exists, reliability of the piezoelectric element may be secured in the event of the piezoelectric element having voltage applied thereto and being driven.

Now, the metallic conversion indicating the Mn content expresses a value that is obtained from the ratio between the Mn weight percentage, where the elements making up the metal oxide expressed in General Expression (1) are subjected to oxide reduction from the content of the metals Ba, Ca, Ti, Zr, and Mn which are measured by a fluorescent X-ray analysis (XRF), ICP emission spectrochemical analysis, or atomic absorption analysis from the piezoelectric material, when the total weight thereof is 100.

If the Mn content is less than 0.02 parts by weight, the advantages of the polarization treatment needed to drive the piezoelectric element becomes insufficient. On the other hand, if the Mn content is greater than 0.40 parts by weight, the piezoelectric features may become insufficient, or unforeseen crystals in a hexagonal form may appear in the piezoelectric features.

Mn is not limited to metallic Mn, and may be included in the piezoelectric material as an Mn component, and the form of the content thereof is not limited. For example, a solid solution may be at the B-site, and may be included in grain boundaries. Also, Mn components may be included in the piezoelectric material in the form of metal, ion, oxide, metal salt, a complex, or the like. A more favorable form of the content is to have a solid solution at the B-site, from the perspective of insulation properties and ease of sintering. In the case of a solid solution at the B-site, if we say that the ratio of the mol amount of Ba and Ca at the A-site and the mol amount of Ti, Zr, and Mn at the B-site is A/B, the favorable A/B range is 0.993≤A/B≤0.998. The piezoelectric elements where A/B is within this range have a large stretching vibration in the lengthwise direction of the piezoelectric element, and since the mechanical quality coefficient is high, excels in dust removing capabilities, whereby a dust removing device having excellent durability may be obtained. Also, the piezoelectric material may include the General Expression (1) and a range where the features do not modify the components (sub-components) other than Mn.

EXAMPLES

The piezoelectric material used for the piezoelectric element according to the present embodiment described above will be described in detail, giving an example below, but the embodiments are not limited to the example below.

Manufacturing Example 1

Barium titanate having an average grain diameter of 100 nm (BT-01, manufactured by Sakai Chemical Industry Co., Ltd.), calcium titanate having an average grain diameter of 300 nm (CT-03, manufactured by Sakai Chemical Industry Co., Ltd.), and calcium zirconate having an average grain diameter of 300 nm (CZ-03, manufactured by Sakai Chemical Industry Co., Ltd.) are weighed so as to have a mol ratio of 83.0:10.5:6.5 (see Table 1).

Next the weighed grains are mixed by 24-hour dry blending using a ball mill. In order to granulate the obtained mixed grains, manganese acetate (II) having a 0.18 parts by weight Mn by metallic conversion as to the mixed grains and a PVA binder having 3 parts by weight as to the mixed grains are adhered to the mixed grain surfaces using a spray dryer apparatus.

Next, the obtained grains are poured into a metal form, a forming pressure of 200 MPa is applied using a press compacting machine, and a disc-shaped compact is created. This compact may be further pressed using a cold isostatic press.

The obtained compact is placed in an electric kiln, maintained for five hours at a maximum temperature of 1340° C., and sintered in the atmosphere for a total of 24 hours.

Next, the composition is evaluated by a fluorescent X-ray analysis. As a result, we may see that Mn content of 0.18 parts by weight is in the composition which may be expressed by a chemical formula of $(Ba_{0.830}Ca_{0.170})(Ti_{0.935}Zr_{0.065})O_3$. This indicates that the weighed composition and the composition after sintering are the same. Also, elements other than Ba, Ca, Ti, Zr, and Mn have an amount of less than the detection limit, and are less than 1 part by weight.

Further, crystal compositions were analyzed by X-ray analysis at 25° C. and at −70° C. Consequently, just peaks that are similar to the perovskite configuration were observed. Also, as a result of subjecting the X-ray analysis to Rietveld analysis, crystalline phases that are tetragon at 25° C. and rhombic at −70° C. were found.

Manufacturing Example 1 for Comparison

In order to manufacture grains of Barium titanate having an average grain diameter of 100 nm (BT-01, manufactured by Sakai Chemical Industry Co., Ltd.), manganese acetate (II) having 0.12 parts by weight Mn by metallic conversion as to the mixed grains and a PVA binder having 3 parts by weight as to the mixed grains are adhered to the mixed grain surfaces using a spray dryer apparatus.

Next, the obtained grains are poured into a metal form, a forming pressure of 200 MPa is applied using a press compacting machine, and a disc-shaped compact is created. The obtained compact is placed in an electric kiln and maintained for five hours at a maximum temperature of 1380° C., and fired in the atmosphere for a total of 24 hours.

Next, the composition is evaluated by a fluorescent X-ray analysis. As a result, we may see that Mn content of 0.12 parts by weight is in the composition which may be expressed by a chemical formula of $BaTiO_3$. Also, elements other than Ba, Ca, Ti, Zr, and Mn have an amount of less than the detection limit, and are less than 1 part by weight.

Further, the crystal compositions were analyzed by X-ray analysis at 25° C. and −70° C. Consequently, just peaks that are similar to the perovskite configuration were observed. Also, as a result of subjecting the X-ray analysis to Rietveld analysis, crystalline phases that are tetragon at 25° C. and rhombic at −70° C. were found.

Manufacturing Example 2 for Comparison

A sintered compact of zirconate titanate is prepared. Further, the crystal compositions were analyzed by X-ray analysis at 25° C. and at −70° C. Consequently, just peaks that are similar to the perovskite configuration were observed. Also, as a result of subjecting the X-ray analysis to Rietveld analysis, crystalline phases that are tetragon at 25° C. and rhombic at −70° C. were found.

Embodiment 1 and Comparison Example 1

Piezoelectric material for the manufacturing example 1 and a manufacturing example 1 for comparison is used to create a piezoelectric element for the Embodiment 1 and comparison example 1.

The piezoelectric material is subjected to a polishing process to a thickness of 0.5 mm, Ti and Au in the order of Ti, Au are formed on two faces by DC magnetron sputtering with a thickness of 30 nm and 380 nm, respectively, thereby forming a piezoelectric element having a first electrode and second electrode.

Next, upon subjecting the piezoelectric elements to a cut process to 10.0 mm×2.5 mm×0.5 mm, the piezoelectric elements are subjected to polarization treatment using a direct current to the piezoelectric elements. The temperature is 100° C., the applied electric field is 1 kV/mm, and the voltage application time is 30 minutes. The polarization axis direction of the piezoelectric elements is parallel to the thickness direction thereof.

Further, the piezoelectric elements of the Embodiment 1 and Comparison Example 1 are subjected to minute current electrical field application and permittivity measured while changing the measurement temperature, and the phase transition temperature T is evaluated. The result is that the phase transition temperature T is −32° C. and 6° C. in the Embodiment 1 and Comparison Example 1, respectively.

Comparison Example 2

A piezoelectric element of a comparison example 2 is manufactured using the piezoelectric material of the manufacturing example 2 for comparison. The piezoelectric material is subjected to a polishing process to a thickness of 0.25 mm, Ti and Au in the order of Ti, Au are formed on two faces by DC magnetron sputtering with a thickness of 30 nm and 380 nm, respectively, thereby forming a piezoelectric element having a first electrode and second electrode.

Next, upon subjecting the piezoelectric elements to a cut process to 10.0 mm×2.5 mm×0.5 mm, the piezoelectric elements are subjected to polarization treatment using a direct current to the piezoelectric elements. The temperature is 200° C., the applied electric field is 1.7 kV/mm, and the voltage application time is 30 minutes. The polarization axis direction of the piezoelectric elements is parallel to the thickness direction thereof.

Further, the piezoelectric elements of the Comparison Example 2 are subjected to minute current electrical field application and permittivity measured while changing the measurement temperature, and the phase transition temperature T is evaluated. The result is that the phase transition temperature T did not exist at least in the range of −60° C. to 50° C.

Evaluation of Piezoelectric Elements of Embodiment 1 and Comparison Example 1 and Comparison Example 2

Next, using a resonance-antiresonance method, a piezoelectric constant $d_{31}$, elastic constant $Y_{11}$, and resonance frequency for the piezoelectric elements in the embodiment 1, comparison example 1, and comparison example 2 are found. The measurement is started at 30° C., and measurement is performed while changing the temperature in the order of increased temperature, decreased temperature, and increased temperature up to 30° C. Measurement is performed within a constant-temperature oven, wherein each temperature is maintained for a fixed amount of time, and after the temperature has stabilized, the piezoelectric constant $d_{31}$, elastic constant $Y_{11}$, and resonance frequency are evaluated.

Now, as the temperature of the piezoelectric element of the embodiment 1 is decreased, the piezoelectric constant increases, the elastic constant decreases, and the resonance frequency decreases. On the other hand, as to the piezoelectric element of the comparison example 1, a feature pole change exists near 5° C., and at near 5° C. the piezoelectric constant is maximized, the elastic constant is minimized, and the resonance frequency is minimized. Also, the piezoelectric element of the comparison example 2 is not dependent on temperature for any physical properties, and remains approximately constant.

Manufacturing Examples 2 through 27

Barium titanate having an average grain diameter of 100 nm (BT-01, manufactured by Sakai Chemical Industry Co., Ltd.), calcium titanate having an average grain diameter of 300 nm (CT-03, manufactured by Sakai Chemical Industry Co., Ltd.), and calcium zirconate having an average grain diameter of 300 nm (CZ-03, manufactured by Sakai Chemical Industry Co., Ltd.) are weighed so as to have the mol ratio shown in Table 1.

Next the weighed grains are mixed by 24-hour dry blending using a ball mill. In order to granulate the obtained mixed grains, manganese acetate (II) having the parts-by-weight shown in Table 1 of Mn as to the mixed grains, and a PVA binder having 3 parts by weight by metallic conversion as to the mixed grains, are adhered to the mixed grain surfaces using a spray dryer apparatus.

Next, the obtained grains are poured into a metal form, a forming pressure of 200 MPa is applied using a press compacting machine, and a disc-shaped compact is created. This compact may be further pressed using a cold isostatic press.

The obtained compact is placed in an electric kiln, maintained for five hours at a maximum temperature of 1350° C. to 1480° C., and sintered in the atmosphere for a total of 24 hours. The maximum temperature is increased as the amount of Ca increased.

Next, the composition is evaluated by a fluorescent X-ray analysis. As a result, we may see that Mn content of the percent of the weight shown in Table 1 is in the composition (x and y are described in Table 2) which may be expressed by a chemical formula of $(Ba_{1-x}Ca_x)(Ti_{1-y}Zr_y)O_3$. Also, elements other than Ba, Ca, Ti, Zr, and Mn have an amount of less than the detection limit, and are less than 1 percent of the weight.

Further, crystal compositions were analyzed by X-ray analysis at 25° C. and at −70° C. Consequently, just peaks that are similar to the perovskite configuration were observed.

Also, as a result of subjecting the X-ray analysis to Rietveld analysis, crystalline phases that are tetragon at 25° C. and rhombic at −70° C. were found.

Embodiments 2 through 27

Piezoelectric elements of second through twenty-seventh embodiments are manufactured, using the piezoelectric material in manufacturing examples 2 through 27.

The piezoelectric material is subjected to a polishing process to a thickness of 0.5 mm, Ti and Au in the order of Ti, Au are formed on two faces by DC magnetron sputtering with a thickness of 30 nm and 380 nm, respectively, thereby forming a piezoelectric element having a first electrode and second electrode.

Next, upon subjecting the piezoelectric elements to a cut process to 10.0 mm×2.5 mm×0.5 mm, the piezoelectric elements are subjected to polarization treatment using a direct current to the piezoelectric elements. The temperature is 100° C., the applied electric field is 1 kV/mm, and the voltage application time is 30 minutes. The polarization axis direction of the piezoelectric elements is parallel to the thickness direction thereof.

Further, the piezoelectric elements of the second through twenty-seventh embodiments are subjected to minute current electrical field application and permittivity measured while changing the measurement temperature, and the phase transition temperature T is evaluated. The result is that the phase transition temperature T is the temperature shown in Table 2.

TABLE 1

|  | $BaTiO_3$ [mol] | $CaTiO_3$ [mol] | $CaZrO_3$ [mol] | Mn parts by weight [% by Weight] |
|---|---|---|---|---|
| Manufacturing Example 1 | 83.00 | 10.50 | 6.50 | 0.18 |
| Manufacturing Example 2 | 84.50 | 11.40 | 4.10 | 0.18 |
| Manufacturing Example 3 | 87.00 | 8.90 | 4.10 | 0.18 |
| Manufacturing Example 4 | 85.75 | 9.75 | 4.50 | 0.18 |
| Manufacturing Example 5 | 87.00 | 8.00 | 5.00 | 0.18 |
| Manufacturing Example 6 | 85.00 | 10.00 | 5.00 | 0.18 |
| Manufacturing Example 7 | 86.00 | 8.00 | 6.00 | 0.18 |
| Manufacturing Example 8 | 86.00 | 8.00 | 6.00 | 0.16 |
| Manufacturing Example 9 | 86.00 | 8.00 | 6.00 | 0.14 |
| Manufacturing Example 10 | 81.30 | 12.70 | 6.00 | 0.24 |
| Manufacturing Example 11 | 81.30 | 12.70 | 6.00 | 0.24 |
| Manufacturing Example 12 | 81.30 | 12.70 | 6.00 | 0.24 |
| Manufacturing Example 13 | 83.00 | 10.10 | 6.90 | 0.18 |
| Manufacturing Example 14 | 83.00 | 11.00 | 6.00 | 0.18 |
| Manufacturing Example 15 | 84.00 | 10.10 | 5.90 | 0.18 |
| Manufacturing Example 16 | 87.00 | 7.00 | 6.00 | 0.15 |
| Manufacturing Example 17 | 84.00 | 11.00 | 5.00 | 0.18 |
| Manufacturing Example 18 | 83.00 | 10.10 | 6.90 | 0.18 |
| Manufacturing Example 19 | 83.00 | 10.50 | 6.50 | 0.18 |
| Manufacturing Example 20 | 83.00 | 11.00 | 6.00 | 0.18 |
| Manufacturing Example 21 | 84.00 | 10.10 | 5.90 | 0.18 |
| Manufacturing Example 22 | 84.00 | 10.50 | 5.50 | 0.18 |
| Manufacturing Example 23 | 84.00 | 11.00 | 5.00 | 0.18 |
| Manufacturing Example 24 | 83.00 | 10.10 | 6.90 | 0.24 |
| Manufacturing Example 25 | 83.00 | 10.10 | 6.90 | 0.30 |
| Manufacturing Example 26 | 84.00 | 10.10 | 5.90 | 0.24 |
| Manufacturing Example 27 | 84.00 | 10.10 | 5.90 | 0.30 |
| Manufacturing Example 1 for Comparison | 100.00 | 0.00 | 0.00 | 0.12 |

TABLE 2

| | | x | y | Mn parts by weight [% by Weight] | Sub-Component [% by Weight] | Phase Transition Temperature after Polarization [° C.] |
|---|---|---|---|---|---|---|
| Embodiment 1 | Manufacturing Example 1 | 0.1700 | 0.065 | 0.18 | 0.0 | −32 |
| Embodiment 2 | Manufacturing Example 2 | 0.1550 | 0.041 | 0.18 | 0.0 | −46 |
| Embodiment 3 | Manufacturing Example 3 | 0.1300 | 0.041 | 0.18 | 0.0 | −40 |
| Embodiment 4 | Manufacturing Example 4 | 0.1425 | 0.045 | 0.18 | 0.0 | −44 |
| Embodiment 5 | Manufacturing Example 5 | 0.1300 | 0.050 | 0.18 | 0.0 | −29 |
| Embodiment 6 | Manufacturing Example 6 | 0.1500 | 0.050 | 0.18 | 0.0 | −44 |
| Embodiment 7 | Manufacturing Example 7 | 0.1400 | 0.060 | 0.18 | 0.0 | −20 |
| Embodiment 8 | Manufacturing Example 8 | 0.1400 | 0.060 | 0.16 | 0.0 | −16 |
| Embodiment 9 | Manufacturing Example 9 | 0.1400 | 0.060 | 0.14 | 0.0 | −16 |
| Embodiment 10 | Manufacturing Example 10 | 0.1870 | 0.060 | 0.24 | 0.0 | −38 |
| Embodiment 11 | Manufacturing Example 11 | 0.1870 | 0.060 | 0.24 | 0.0 | −62 |
| Embodiment 12 | Manufacturing Example 12 | 0.1870 | 0.060 | 0.24 | 0.0 | −60 |
| Embodiment 13 | Manufacturing Example 13 | 0.1700 | 0.069 | 0.18 | 0.0 | −24 |
| Embodiment 14 | Manufacturing Example 14 | 0.1700 | 0.060 | 0.18 | 0.0 | −34 |
| Embodiment 15 | Manufacturing Example 15 | 0.1600 | 0.059 | 0.18 | 0.0 | −38 |
| Embodiment 16 | Manufacturing Example 16 | 0.1300 | 0.500 | 0.15 | 0.0 | −5 |
| Embodiment 17 | Manufacturing Example 17 | 0.1600 | 0.050 | 0.18 | 0.0 | −52 |
| Embodiment 18 | Manufacturing Example 18 | 0.1700 | 0.069 | 0.18 | 0.0 | −26 |
| Embodiment 19 | Manufacturing Example 19 | 0.1700 | 0.065 | 0.18 | 0.0 | −36 |
| Embodiment 20 | Manufacturing Example 20 | 0.1700 | 0.060 | 0.18 | 0.0 | −40 |
| Embodiment 21 | Manufacturing Example 21 | 0.1600 | 0.059 | 0.18 | 0.0 | −36 |
| Embodiment 22 | Manufacturing Example 22 | 0.1600 | 0.055 | 0.18 | 0.0 | −40 |
| Embodiment 23 | Manufacturing Example 23 | 0.1600 | 0.050 | 0.18 | 0.0 | −50 |
| Embodiment 24 | Manufacturing Example 24 | 0.1700 | 0.069 | 0.24 | 0.0 | −20 |
| Embodiment 25 | Manufacturing Example 25 | 0.1700 | 0.069 | 0.30 | 0.0 | −20 |
| Embodiment 26 | Manufacturing Example 26 | 0.1600 | 0.059 | 0.24 | 0.0 | −42 |
| Embodiment 27 | Manufacturing Example 27 | 0.1600 | 0.059 | 0.30 | 0.0 | −42 |
| Comparison Example 1 | Manufacturing Example 1 for Comparison | 0.0000 | 0.000 | 0.12 | 0.0 | 6 |

Other Embodiments

The vibration apparatus and driving method of the first embodiment may be provided to a scanner part of a photocopier which is another optical device and use to remove dust, or may be used in a driving device to move toner which is a powder. The dust or powder that is positioned in a region over a wide range may be efficiently moved, and a thin type of dust removing device or driving apparatus may be realized. The target item to be moved (driven body) of the dust removing device is not limited to dust or powder, but a solid or gas or liquid may also be moved. Also, the driving apparatus drives a driven body by a vibration apparatus. An example of the driven body may be a constructed body to be driven (e.g., a constructed body such as a holder or the like to hold a lens), or a sheet member or the like. According to the first embodiment, vibration modes to be considered are given as first through fourth vibration modes, but if other vibration modes are added thereto and setting values of the alternating voltages are computed, the advantages further increase. Also, of the unnecessary vibration modes, the vibration mode having more influence is the third vibration mode, and compared thereto the influence order of the fourth vibration mode is relatively small. Accordingly, in the event of computing the settings of the alternating voltages, the fourth vibration mode is omitted from the calculations as needed, the advantages are still obtained. Also, as a vibration mode to be dedicated primarily to moving dust, according to the first embodiment the out-of-plane tenth order bending vibration mode (first vibration mode) and the out-of-plane eleventh order bending vibration mode (second vibration mode) are used, but the embodiments are not limited to the combination of these vibration modes. For example, the out-of-plane primary bending mode and out-of-plane secondary bending mode may be combined. Also, the out-of-plane m'th order bending mode and out-of-plane n'th order bending mode may be combined. In this case, m and n only have to be different natural numbers. Regardless of the combination of vibration modes dedicated primarily to moving dust, by considering the responses of other vibration modes, and by setting the regions and alternating voltages, and driving, the advantages may be obtained.

According to the first embodiment, there are ten regions, and recognizing the symmetry of the vibration responses, regions having the same vibration responses are selected, and the same alternating voltage is set in one region which is a combination of the regions having the same vibration responses. Thus, five regions having different alternating voltages are set. However, the number of regions in which to set the same alternating voltages is not limited to five. If there are two or more regions having different alternating voltages, an optimal vibration state may be realized for each region, and the advantage of moving a driven object including dust efficiently in a predetermined direction, may be obtained.

Also, "alternating voltage settings" includes the voltage amplitude ratio of the alternating voltage and the time phase difference of the alternating voltage. Settings of a first alternating voltage having a first voltage amplitude ratio and first time phase difference are determined as to the first region of the vibrating body. Settings of a second alternating voltage having a second voltage amplitude ratio and second time phase difference are determined as to the second region of the vibrating body, which differs from the first region. Now, at least one of the first voltage amplification ratio and second voltage amplification ratio, or the first time phase difference and second time phase difference, is different. By switching between the first alternating voltages settings and the second alternating voltages settings, and driving the vibrating body, an optimal vibration state may be realized for each region, and the advantage of efficiently moving the driven target, including dust, in the predetermined direction may be obtained.

Thus, the number of regions is not limited to the number exemplified in the embodiment. Also, according to the first embodiment, a third vibration mode and fourth vibration mode are considered, having the same displacement distribution in the left/right direction (first direction A) as the first and second vibration modes, as unnecessary vibration modes. Therefore, the displacement distribution in the left/right direction (first direction A) of the vibrations excited in the optical element 1 is not changed by the vibrations of the third and fourth vibration modes. Accordingly, a region divided in the left/right direction (first direction) is not provided. However, unlike the first embodiment, there are cases where a vibration mode, serving as an unnecessary vibration mode, having a different displacement distribution from the first and second vibration modes in the left/right direction (first direction), which are primarily dedicated to moving dust, has large vibrations. In such a case, the above-described unnecessary vibration mode is considered, and a region that virtually divides the optical element 1 in the left/right direction (first direction A) may be provided as needed. According to the driving method herein, even in the case that the displacement distribution in the left/right direction (first direction A) is changed by the vibrations of the unnecessary vibration mode, an optimal vibration state may be realized for each region, and the advantage of moving a driven object including dust efficiently in a predetermined direction, may be obtained.

Also, according to the first embodiment, the setting of φ(10, b)−φ(11, b) is set as 90°, but the embodiment is not limited to 90°, as long as the time phase difference of the tenth order vibrations and eleventh order vibrations described above are different. Also, if φ(10, b)−φ(11, b) is a value greater than −180° and smaller than 0°, the direction in which the dust or the like is moved may be inverted. Also, even if a combination of a driving voltage and an applying piezoelectric element 2 is switched, so that the driving voltage E(1) is applied to the piezoelectric element 2b on the right, and the driving voltage E(2) is applied to the piezoelectric element 2a on the left, the direction in which the dust or the like is moved may be inverted. Settings for such an inverted alternating voltage may be added to the driving procedures.

According to an embodiment, a driven target which includes dust may be efficiently moved by vibrations in a predetermined direction.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-063898 filed Mar. 21, 2012, which is hereby incorporated by reference herein in its entirety.

What is claimed is:

1. A vibration apparatus comprising:
a vibrating body comprising an electromechanical energy converting element comprising:
an electrode; and
a piezoelectric material having a lead content of less than 1000 ppm; and
a control unit that generates a combined vibration by generating multiple stable waves having mutually different orders with a time phase difference by applying at least two driving voltages to the electromechanical energy converting element,
wherein the control unit changes at least one of the voltage amplitude ratio and time phase difference of at least the two driving voltages, so as to change the amplitude distribution of the combined vibration.

2. The vibration apparatus according to claim 1, wherein at least one of the voltage amplitude ratio and time phase difference of the driving voltages is changed, so as to change the amplitude distribution and phase distribution of the combined vibration.

3. The vibration apparatus according to claim 1, wherein, the control unit performs at least one of
control to change the voltage amplitude ratio of the driving voltages in a time-series manner from the first voltage amplitude ratio to the n'th voltage amplitude ratio wherein the first voltage amplitude ratio is obtained for a first region of the vibrator and the n'th voltage amplitude ratio is obtained for a n'th region of the vibrator; and
control to change the time phase difference of the driving voltages in a time-series manner from the first time phase difference to the n'th time phase difference wherein the first time phase difference is obtained for a first region of the vibrator and n'th time phase difference is obtained for a n'th region of the vibrator,
wherein the first region to the n'th region are consecutively positioned in a direction in which a nodal line of at least one of multiple stable waves, and wherein n is an integer that is equal to or greater than 2.

4. The vibration apparatus according to claim 3, wherein the control unit performs at least one of
control to sequentially switch the voltage amplitude ratio of the driving voltages in predetermined time units in a time-series manner from the first voltage amplitude ratio to the n'th voltage amplitude ratio; and
control to sequentially switch the time phase difference of the driving voltages in predetermined time units in a time-series manner from the first time phase difference to the n'th time phase difference.

5. The vibration apparatus according to claim 1, wherein the piezoelectric material is a piezoelectric ceramic having barium titanate as the main component thereof.

6. The vibration apparatus according to claim 5, wherein the piezoelectric material comprises a perovskite-like metal oxide as a main component, the perovskite-like metal oxide being expressed by a General Expression (1)

$$(Ba_{1-x}Ca_x)(Ti_{1-y}Zr_y)O_3 \qquad (1),$$

wherein x and y satisfy $0.02 \le x \le 0.30$, $0.020 \le y \le 0.095$, and $y \le x$.

7. The vibration apparatus according to claim 6, wherein the piezoelectric material comprises the perovskite-like metal oxide expressed by the General Expression (1) as a main component,
wherein the perovskite-like metal oxide includes a Mn, and
wherein a Mn content is 0.02 parts by weight or greater and 0.40 parts by weight or less with respect to the perovskite-like metal oxide of 100 parts by weight in terms of metal element.

8. A driving apparatus comprising:
the vibration apparatus according to claim 1; and
a driven body;
wherein the driven body is driven by the vibration apparatus.

9. The vibration apparatus according to claim 1, wherein the vibration apparatus functions as a dust removing device to move dust on the vibrating body and remove the dust by the combined vibrations.

10. An optical device, comprising:

a vibration apparatus, which is the dust removing device according to claim 9, wherein the vibrating body is provided on the light path; and an imaging device into which light that has transmitted the vibrating body enters.

11. The vibration apparatus according to claim 1, wherein the multiple stable waves include:

a first stable wave generated in a first vibration mode; and a second stable wave generated in a second vibration mode;

wherein when the control unit changes the voltage amplitude ratio of the driving voltages:

the first voltage amplitude ratio is set so that, in the first region, a value of the amplitude at the location of maximum displacement within a displacement distribution in the first vibration mode is equal to a value of the amplitude at the location of maximum displacement within the displacement distribution in the second vibration mode; and the n'th voltage amplitude ratio is set so that, in the n'th region, a value of the amplitude at the location of maximum displacement within a displacement distribution in the second vibration mode is equal to a value of the amplitude at the location of maximum displacement within the displacement distribution in the second vibration mode, and wherein when the control unit changes the time phase difference of the driving voltages:

the first time phase difference is set so that, in the first region, a difference between the first vibration mode and the second vibration mode in a value of a response phase at a location where a displacement is positive is 90 degree; and the n'th time phase difference is set so that, in the n'th region, a difference between the first vibration mode and the second vibration mode in a value of a response phase at a location where a displacement is positive is 90 degree.

12. The vibration apparatus according to claim 1, wherein the combined vibration includes a nodal line, and wherein the control unit changes the at least one of the voltage amplitude ratio and time phase difference so as to change the amplitude distribution of the combined vibration in a direction in which the nodal line extends.

13. The vibration apparatus according to claim 1, wherein the control unit changes the voltage amplitude ratio so as to change the amplitude distribution of the combined vibration, and wherein a voltage amplitude ratio after the change is different from a reciprocal of a voltage amplitude ratio before the change.

* * * * *